United States Patent
Liu et al.

(10) Patent No.: US 12,444,345 B2
(45) Date of Patent: Oct. 14, 2025

(54) DISPLAY SUBSTRATE AND BRIGHTNESS COMPENSATION METHOD THEREOF, AND DISPLAY APPARATUS

(71) Applicant: BOE Technology Group Co., Ltd., Beijing (CN)

(72) Inventors: Weixing Liu, Beijing (CN); Kuanjun Peng, Beijing (CN); Bin Qin, Beijing (CN); Kai Guo, Beijing (CN); Tieshi Wang, Beijing (CN); Fangzhen Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/273,989

(22) PCT Filed: Jul. 7, 2022

(86) PCT No.: PCT/CN2022/104301
§ 371 (c)(1),
(2) Date: Jul. 25, 2023

(87) PCT Pub. No.: WO2023/000989
PCT Pub. Date: Jan. 26, 2023

(65) Prior Publication Data
US 2024/0412682 A1    Dec. 12, 2024

(30) Foreign Application Priority Data
Jul. 20, 2021 (CN) .......................... 202110818829.2

(51) Int. Cl.
*G09G 3/32* (2016.01)
*H01L 25/075* (2006.01)
(Continued)

(52) U.S. Cl.
CPC ........... *G09G 3/32* (2013.01); *H01L 25/0753* (2013.01); *H01L 25/167* (2013.01);
(Continued)

(58) Field of Classification Search
CPC ............. G09G 3/32; G09G 2300/0842; G09G 2310/08; G09G 2320/041;
(Continued)

(56) References Cited

U.S. PATENT DOCUMENTS 9,535,531 B2 *   1/2017   Tan .................. G06F 3/0412
2008/0203930 A1 *   8/2008   Budzelaar ........... G09G 3/3233
                                                        345/76

(Continued)

FOREIGN PATENT DOCUMENTS

CN    102930818 A    2/2013
CN    103400545 A    11/2013
(Continued)

OTHER PUBLICATIONS

International Search Report for PCT/CN2022/104301 Mailed Sep. 16, 2022.
(Continued)

*Primary Examiner* — William Lu
(74) *Attorney, Agent, or Firm* — Ling Wu; Stephen Yang; Ling and Yang Intellectual Property

(57) ABSTRACT

A display substrate (910), comprising a plurality of pixel units (P11, P12, P21, P22) and at least one compensation circuit. At least one pixel unit (P11, P12, P21, P22) comprises: a main light-emitting unit and an auxiliary light-emitting unit; and the at least one compensation circuit is connected to the auxiliary light-emitting unit of the at least one pixel unit (P11, P12, P21, P22). The at least one compensation circuit is configured to measure the brightness or temperature of the at least one pixel unit (P11, P12, P21,
(Continued)

P22) and control the auxiliary light-emitting unit of the at least one pixel unit (P11, P12, P21, P22) to emit light according to a measurement result.

11 Claims, 13 Drawing Sheets

(51) Int. Cl.
 *H01L 25/16* (2023.01)
 *H10H 20/857* (2025.01)
(52) U.S. Cl.
 CPC ... *H10H 20/857* (2025.01); *G09G 2300/0842* (2013.01); *G09G 2310/08* (2013.01); *G09G 2320/041* (2013.01); *G09G 2320/0626* (2013.01)
(58) Field of Classification Search
 CPC ........ G09G 2320/0626; H01L 25/0753; H01L 25/167; H01L 33/62
 See application file for complete search history.

(56) References Cited

U.S. PATENT DOCUMENTS

| | | | | |
|---|---|---|---|---|
| 2010/0289831 | A1* | 11/2010 | Yamamoto | G09G 3/3233 345/55 |
| 2015/0077447 | A1* | 3/2015 | Zhang | G02F 1/167 345/694 |
| 2015/0145907 | A1* | 5/2015 | Ryu | G09G 3/3233 345/697 |
| 2015/0348504 | A1* | 12/2015 | Sakariya | G09G 3/2092 345/82 |
| 2015/0364107 | A1* | 12/2015 | Sakariya | G06F 3/042 345/82 |
| 2016/0104431 | A1* | 4/2016 | Park | G09G 3/3233 345/78 |
| 2016/0189634 | A1* | 6/2016 | Kim | G09G 3/2003 345/691 |
| 2016/0284280 | A1* | 9/2016 | Mu | G09G 3/3258 |
| 2017/0124956 | A1* | 5/2017 | Yin | G09G 3/3291 |
| 2017/0169796 | A1* | 6/2017 | Tai | G09G 3/3233 |
| 2018/0122978 | A1* | 5/2018 | Khatibzadeh | H01L 33/06 |
| 2018/0308918 | A1* | 10/2018 | Choi | H10K 59/131 |
| 2019/0221633 | A1* | 7/2019 | Gai | H10K 59/1315 |
| 2019/0279563 | A1* | 9/2019 | Hwang | G09G 3/3225 |
| 2019/0280174 | A1* | 9/2019 | Okahisa | H01L 27/156 |
| 2019/0325812 | A1* | 10/2019 | Mao | G06F 3/1446 |
| 2020/0160791 | A1* | 5/2020 | Chung | G09G 3/3275 |
| 2020/0193902 | A1* | 6/2020 | Hsu | G09G 3/3406 |
| 2020/0212137 | A1 | 7/2020 | Wang et al. | |
| 2020/0213500 | A1* | 7/2020 | Kobayashi | H04N 23/60 |
| 2020/0328260 | A1* | 10/2020 | Tang | H10K 59/60 |
| 2020/0335035 | A1* | 10/2020 | Gai | G09G 3/3266 |
| 2020/0403057 | A1* | 12/2020 | Kang | H10K 59/121 |
| 2021/0183296 | A1* | 6/2021 | Lee | G09G 3/2003 |
| 2021/0191552 | A1* | 6/2021 | Bok | G06F 1/1643 |
| 2021/0193769 | A1* | 6/2021 | Bok | H10K 59/60 |
| 2021/0201805 | A1* | 7/2021 | Feng | G09G 3/3258 |
| 2021/0335251 | A1* | 10/2021 | Liu | G09G 3/3233 |
| 2021/0343819 | A1* | 11/2021 | Liu | H10K 59/13 |
| 2021/0366394 | A1* | 11/2021 | Gai | G09G 3/3233 |
| 2022/0114958 | A1* | 4/2022 | Feng | H10D 86/00 |
| 2022/0262301 | A1* | 8/2022 | Kuo | G09G 3/32 |
| 2022/0343823 | A1* | 10/2022 | Wang | G09G 3/32 |
| 2023/0100284 | A1* | 3/2023 | Yao | G09G 3/20 345/55 |

FOREIGN PATENT DOCUMENTS

| | | | | |
|---|---|---|---|---|
| CN | 108538255 | A | | 9/2018 |
| CN | 108649059 | A | | 10/2018 |
| CN | 109637455 | A | * | 4/2019 ......... G09G 3/3233 |
| JP | 2006337986 | A | | 12/2006 |
| JP | 2016085296 | A | | 5/2016 |

OTHER PUBLICATIONS

Chen et al., In-Pixel Temperature Sensor for High-Luminance Active-Matrix Micro-LED Display using LTPO TFTs, SID 2020 DIGEST, pp. 559-562.

\* cited by examiner

DISPLAY SUBSTRATE AND BRIGHTNESS COMPENSATION METHOD THEREOF, AND DISPLAY APPARATUS

CROSS-REFERENCE TO RELATED APPLICATIONS

The present application is a U.S. National Phase Entry of PCT Application No. PCT/CN2022/104301, filed on Jul. 7, 2022, which claims priority to Chinese Patent Application No. 202110818829.2 filed to the CNIPA on Jul. 20, 2021 and entitled "Display Substrate and Brightness Compensation Method thereof, and Display Apparatus", and the entire contents of the above-mentioned applications are incorporated into the present application by reference.

TECHNICAL FIELD

The present disclosure relates to, but is not limited to, the field of display technologies, and particularly to a display substrate and a brightness compensation method thereof, and a display apparatus.

BACKGROUND

LED (Light Emitting Diode) is widely used in fields such as traditional display, near-eye display, three-dimensional (3D) display and transparent display because of its high efficiency, high brightness, high reliability, energy saving and fast response speed.

SUMMARY

The following is a summary of subject matters described herein in detail. The summary is not intended to limit the protection scope of claims.

An embodiment of the disclosure provides a display substrate, a brightness compensation method thereof and a display apparatus.

In one aspect, an embodiment of the present disclosure provides a display substrate including a plurality of pixel units and at least one compensation circuit. At least one pixel unit includes a main light emitting unit and an auxiliary light emitting unit; wherein at least one compensation circuit is connected to the auxiliary light emitting unit of at least one pixel unit. The at least one compensation circuit is configured to detect the brightness or temperature of the at least one pixel unit and control the auxiliary light emitting unit of the at least one pixel unit to emit light according to the detection result.

In some exemplary implementations, the compensation circuit includes a compensation control circuit and at least one detection circuit connected to the compensation control circuit; wherein the detection circuit is connected with an auxiliary light emitting unit of one pixel unit. The detection circuit is configured to detect the brightness of the connected pixel unit. The compensation control circuit is configured to control the auxiliary light emitting unit connected to the detection circuit to emit light according to the detection result of the detection circuit.

In some exemplary implementations, the compensation control circuit includes a first control sub-circuit and a second control sub-circuit. The first control sub-circuit is connected to a first scan line, one voltage detection circuit and one detection circuit, and is configured to transmit a detection result of the detection circuit to the voltage detection circuit under the control of the first scan line, so that an external control circuit connected to the voltage detection circuit updates a compensation control signal according to the detection result. The second control sub-circuit is connected with the first scan line, a compensation data line, a second power supply line and at least one detection circuit, and is configured to transmit a compensation control signal provided by the compensation data line to the at least one detection circuit under the control of the first scan line, so as to control the at least one detection circuit to transmit the detection result to the corresponding auxiliary light emitting unit.

In some exemplary implementations, the first control sub-circuit includes a seventh transistor; and the second control sub-circuit includes an eighth transistor and a second capacitor. A control electrode of the seventh transistor is connected to the first scan line, a first electrode of the seventh transistor is connected to the voltage detection circuit, and a second electrode of the seventh transistor is connected to the detection circuit. A control electrode of the eighth transistor is connected to the first scan line, a first electrode of the eighth transistor is connected to the compensation data line, a second electrode of the eighth transistor is connected to the second electrode of the second capacitor, and a first electrode of the second capacitor is connected to the second power supply line. The second electrode of the eighth transistor is connected to the at least one detection circuit.

In some exemplary implementations, the detection circuit includes a detection element, a fifth transistor and a sixth transistor. A first electrode of the detection element is connected to a second electrode of the sixth transistor, and a second electrode of the detection element is connected to the second power supply line; a control electrode and a first electrode of the sixth transistor are connected with the first power supply line; a control electrode of the fifth transistor is connected to the compensation control circuit, a first electrode of the fifth transistor is connected to a first electrode of the detection element, and a second electrode of the fifth transistor is connected to the auxiliary light emitting unit.

In some exemplary implementations, the main light emitting unit includes a main light emitting element and a main drive circuit connected to the main light emitting element. The main drive circuit includes a first transistor, a second transistor, a third transistor and a first capacitor; wherein a control electrode of the first transistor is connected to the first scan line, a first electrode of the first transistor is connected to a data line, and a second electrode of the first transistor is connected to a control electrode of the second transistor; a first electrode of the second transistor is connected to the first power supply line, and a second electrode of the second transistor is connected to a first electrode of the third transistor; a control electrode of the third transistor is connected to the second scan line, and a second electrode of the third transistor is connected to the voltage detection circuit; a first electrode of the first capacitor is connected to a control electrode of the second transistor, and a second electrode of the first capacitor is connected to the second electrode of the second transistor. A first electrode of the main light emitting element is connected with the second electrode of the second transistor, and a second electrode of the main light emitting element is connected with the second power supply line.

In some exemplary implementations, the auxiliary light emitting unit includes an auxiliary light emitting element and an auxiliary drive circuit connected to the auxiliary light emitting element. The auxiliary drive circuit includes a fourth transistor; wherein a control electrode of the fourth transistor is connected to the detection circuit, a first electrode of the fourth transistor is connected to the first power supply line, and a second electrode of the fourth transistor is connected to a first electrode of the auxiliary light emitting element; and a second electrode of the auxiliary light emitting element is connected with the second power supply line.

In some exemplary implementations, the compensation circuit includes one detection circuit, wherein the detection circuit is connected to an auxiliary light emitting unit of at least one pixel unit. The detection circuit is configured to detect a temperature of the at least one pixel unit and control the auxiliary light emitting unit of the at least one pixel unit to emit light according to the detection result.

In some exemplary implementations, the detection circuit includes a first detection transistor and a second detection transistor. A control electrode and a first electrode of the first detection transistor are connected to the first power supply line, a second electrode of the first detection transistor is connected to a second electrode of the second detection transistor, and is connected to an auxiliary light emitting unit of at least one pixel unit; and a control electrode and a first electrode of the second detection transistor are connected to the second power supply line. Doping types of the first detection transistor and the second detection transistor are opposite.

In some exemplary implementations, the main light emitting unit includes a main light emitting element and a main drive circuit connected to the main light emitting element. The main drive circuit includes a data write sub-circuit, a drive sub-circuit, a threshold compensation sub-circuit, a storage sub-circuit, an initialization sub-circuit and a light emitting control sub-circuit. The data write sub-circuit is connected to a third scan line, a data line, and a fifth node, and is configured to write a data signal supplied by the data line to the storage sub-circuit under the control of the third scan line. The storage sub-circuit is connected to the fifth node and the sixth node. The drive sub-circuit is connected to the sixth node, the first power supply line and the first electrode of the main light emitting element, and is configured to output a drive current to the main light emitting element under the control of the sixth node. The threshold compensation sub-circuit is connected to the third scan line, the sixth node and the first electrode of the main light emitting element, and is configured to compensate a threshold voltage of the drive sub-circuit under the control of the third scan line. The initialization sub-circuit is connected to the fifth node, an initial signal line, a first reset line, and a second reset line, and is configured to initialize the fifth node under the control of the first reset line or the second reset line. The light emitting control sub-circuit is connected to a light emitting control line, a second power supply line and the second electrode of the main light emitting element, and is configured to turn on the second electrode of the main light emitting element and the second power supply line under the control of the light emitting control line.

In some exemplary implementations, the data write sub-circuit includes a ninth transistor; the drive sub-circuit includes a tenth transistor; the threshold compensation sub-circuit includes an eleventh transistor; and the storage sub-circuit includes a fourth capacitor. The light emitting control sub-circuit includes a twelfth transistor. The initialization sub-circuit includes a thirteenth transistor and a fourteenth transistor. A control electrode of the ninth transistor is connected to the third scan line, a first electrode of the ninth transistor is connected to the data line, and a second electrode of the ninth transistor is connected to the fifth node. A control electrode of the tenth transistor is connected to the fifth node, a first electrode of the tenth transistor is connected to the first power supply line, and a second electrode of the tenth transistor is connected to the first electrode of the main light emitting element. A control electrode of the eleventh transistor is connected to the third scan line, a first electrode of the eleventh transistor is connected to the sixth node, and the second electrode of the eleventh transistor is connected to the second electrode of the tenth transistor. A control electrode of the twelfth transistor is connected to the light emitting control line, a first electrode of the twelfth transistor is connected to the second electrode of the main light emitting element, and a second electrode of the twelfth transistor is connected to the second power supply line. A control electrode of the thirteenth transistor is connected to the first reset line, a first electrode of the thirteenth transistor is connected to the initial signal line, and a second electrode of the thirteenth transistor is connected to the fifth node. A control electrode of the fourteenth transistor is connected to the second reset line, a first electrode of the fourteenth transistor is connected to the initial signal line, and a second electrode of the fourteenth transistor is connected to the fifth node. A first electrode of the fourth capacitor is connected to the fifth node, and a second electrode of the fourth capacitor is connected to the sixth node.

In some exemplary implementations, the auxiliary light emitting unit includes an auxiliary light emitting element and an auxiliary drive circuit connected to the auxiliary light emitting element and the main drive circuit. The auxiliary drive circuit includes a fifteenth transistor. A control electrode of the fifteenth transistor is connected to the sixth node, a first electrode of the fifteenth transistor is connected to the detection circuit, and a second electrode of the fifteenth transistor is connected to the first electrode of the auxiliary light emitting element. The second electrode of the auxiliary light emitting element is connected with the second electrode of the main light emitting element.

In some exemplary implementations, the main light emitting unit includes a main light emitting element and a main drive circuit; the auxiliary light emitting unit includes an auxiliary light emitting element and an auxiliary drive circuit; wherein both the main light emitting element and the auxiliary light emitting element are micro light emitting elements; and a light emitting area of the main light emitting element is larger than that of the auxiliary light emitting element.

In some exemplary implementations, the display substrate includes a base substrate, a circuit structure layer and a plurality of light emitting diode chips arranged on the base substrate; wherein the circuit structure layer includes the compensation circuit and the main drive circuit and the auxiliary drive circuit of the pixel unit; and at least one light emitting diode chip includes a main light emitting element and an auxiliary light emitting element of the pixel unit. The main light emitting element and the auxiliary light emitting element each includes a first semiconductor layer, a quantum well layer and a second semiconductor layer stacked in sequence; wherein the doping types of the first semiconductor layer and the second semiconductor layer are different. The main light emitting element and the auxiliary light emitting element each further includes at least one of a first bonding electrode and a second bonding electrode. The first bonding electrode of the main light emitting element is connected to the first semiconductor layer of the main light emitting element, and the second bonding electrode of the main light emitting element is connected to the second semiconductor layer of the main light emitting element. The first bonding electrode of the auxiliary light emitting element is connected to the first semiconductor layer of the auxiliary light emitting element, and the second bonding electrode of the auxiliary light emitting element is connected to the second semiconductor layer of the auxiliary light emitting element.

In some exemplary implementations, the first semiconductor layer of the main light emitting element and the first semiconductor layer of the auxiliary light emitting element are of an integral structure and are connected to the same first bonding electrode.

In some exemplary implementations, the light emitting diode chip further includes a underlay substrate, and the main and auxiliary light emitting elements are located on the same side of the underlay substrate.

In another aspect, an embodiment of the present disclosure provides a display apparatus, which includes the aforementioned display substrate.

In another aspect, an embodiment of the present disclosure provides a brightness compensation method of a display substrate, which is applied to the display substrate as described above, wherein the brightness compensation method include detecting a brightness or a temperature of at least one pixel unit by a compensation circuit; and the compensation circuit controls the auxiliary light emitting unit of the at least one pixel unit to emit light according to the detection result.

Other aspects will become apparent upon reading and understanding of the accompanying drawings and the detailed description.

BRIEF DESCRIPTION OF DRAWINGS

Accompanying drawings are used to provide an understanding of technical solutions of the present disclosure, form a part of the specification, and are used to explain the technical solutions of the present disclosure together with the embodiments of the present disclosure but are not intended to form limitations on the technical solutions of the present disclosure. Shapes and sizes of one or more components in the drawings do not reflect actual scales, and are only intended to schematically describe contents of the present disclosure.

DETAILED DESCRIPTION

Figure 1:
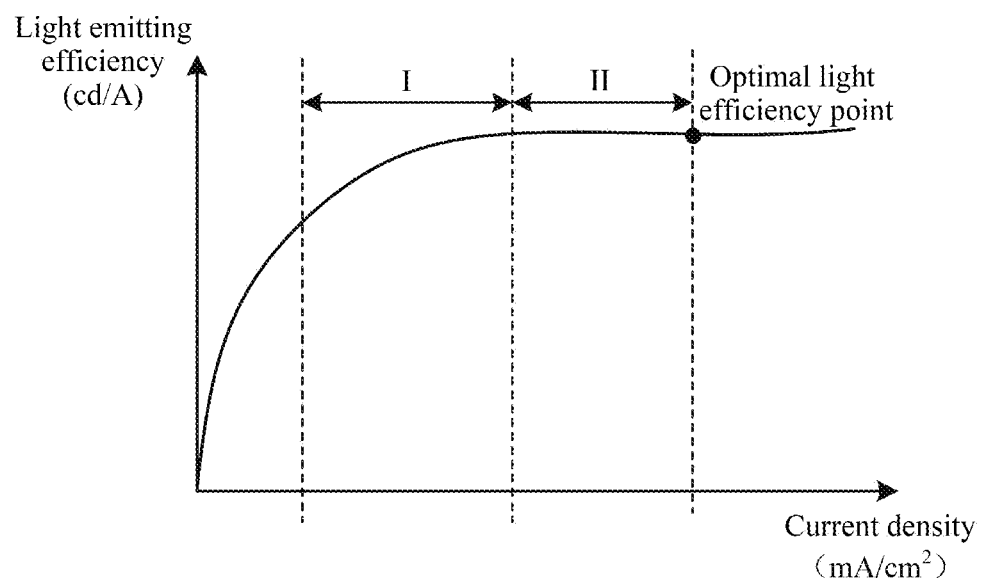
FIG. 1 is a schematic diagram of the relationship between the light emitting efficiency of an LED and the current density flowing through the LED.

The embodiments of the present disclosure will be described below with reference to the drawings in detail. Implementations may be implemented in a plurality of different forms. Those of ordinary skills in the art may easily understand such a fact that implementation modes and contents may be transformed into one or more forms without departing from the purpose and scope of the present disclosure. Therefore, the present disclosure should not be explained as being limited to contents described in following implementation modes only. The embodiments in the present disclosure and features in the embodiments may be combined randomly with each other without conflict.

In the drawings, a size of one or more constituent elements, a thickness of a layer, or a region is sometimes exaggerated for clarity. Therefore, an implementation of the present disclosure is not necessarily limited to the size, and a shape and a size of one or more components in the drawings do not reflect an actual scale. In addition, the drawings schematically illustrate ideal examples, and one implementation of the present disclosure is not limited to the shapes, numerical values, or the like shown in the drawings.

Ordinal numerals such as "first", "second" and "third" in the present disclosure are set to avoid confusion of constituent elements, but not intended for restriction in quantity. In the present disclosure, "multiple" represents two or more than two.

In the present disclosure, for convenience, wordings "central", "up", "down", "front", "back", "vertical", "horizontal", "top", "bottom", "inside", "outside" and the like indicating orientation or positional relationships are used to illustrate positional relationships between constituent elements with reference to the drawings, which are only to facilitate describing the present specification and simplify the description, rather than indicating or implying that involved devices or elements must have specific orientations and be structured and operated in the specific orientations, and thus should not be understood as limitations on the present disclosure. The positional relationships between the constituent elements are changed as appropriate based on directions for describing the constituent elements. Therefore, appropriate replacements may be made according to situations without being limited to the wordings described in the specification.

In the present disclosure, unless otherwise specified and defined, terms "mounting", "mutual connection" and "connection" should be understood in a broad sense. For example, it may be a fixed connection, a detachable connection, or an integrated connection; it may be a mechanical connection or an electrical connection; it may be a direct mutual connection, or an indirect connection through middleware, or internal communication between two elements. Those of ordinary skills in the art may understand meanings of the above-mentioned terms in the present disclosure according to situations. Among them, an "electrical connection" includes a case where constituent elements are connected together through an element with a certain electrical action. The "element with the certain electrical function" is not particularly limited as long as electrical signals can be transmitted between the connected constituent elements. Examples of "an element with a certain electrical action" not only include electrodes and wirings, but also include switching elements such as transistors, resistors, inductors, capacitors, other elements with one or more functions, etc.

In the present disclosure, "parallel" refers to a state in which an angle formed by two straight lines is −10° or more and 10° or less, and thus may include a state in which the angle is −5° or more and 5° or less. In addition, "perpendicular" refers to a state in which an angle formed by two straight lines is 80° or more and 100° or less, and thus may include a state in which the angle is 85° or more and 95° or less.

In the present disclosure, "film" and "layer" are interchangeable. For example, a "conductive layer" may be replaced with a "conductive film" sometimes. Similarly, an "insulation film" may be replaced with an "insulation layer" sometimes.

In the present disclosure, "about" and "substantially" refer to a case that a boundary is not defined strictly and a process and measurement error within a range is allowed.

FIG. 1 is a schematic diagram of the relationship between the light emitting efficiency of an LED and the current density flowing through the LED. As shown in FIG. 1, at a low current density (e.g. a curve segment I), the current density flowing through the LED is small and the light emitting efficiency is low; and at a high current density (e.g. a curve segment II), the LED has a high emitting efficiency.

In some implementations, the LED has a large light emitting area, which easily reduces the current density flowing through the LED, thereby reducing the light emitting efficiency of the LED. However, when the current density is increased to improve the light emitting efficiency of LED, it is easy to increase the power consumption. Moreover, if the LED keeps high light emitting efficiency for a long time, it will work under the condition of high current density for a long time, which will lead to the temperature rise of LED and occurrence of a phenomenon of heat accumulation, which will affect the stability of LED structure and reduce the light emitting efficiency of LED.

An embodiment of the present disclosure provides a display substrate including a plurality of pixel units and at least one compensation circuit. At least one pixel unit includes a main light emitting unit and an auxiliary light emitting unit. At least one compensation circuit is connected to the auxiliary light emitting unit of at least one pixel unit. The at least one compensation circuit is configured to detect the temperature or brightness of the at least one pixel unit and control the auxiliary light emitting unit of the at least one pixel unit to emit light according to the detection result.

A display substrate provided in the present embodiment may use emitting light by a compensation circuit and an auxiliary light to compensate the reduced brightness in a case that the brightness of the main light emitting unit is attenuated due to the temperature rise, thereby improving the brightness attenuation due to the temperature rise and improving the display effect.

In some exemplary implementations, the compensation circuit includes a compensation control circuit and at least one detection circuit connected to the compensation control circuit. One detection circuit is connected to an auxiliary light emitting unit of one pixel unit. The detection circuit is configured to detect the brightness of the connected pixel unit. The compensation control circuit is configured to control the auxiliary light emitting unit connected to the detection circuit to emit light according to the detection result of the detection circuit. In some examples, the compensation circuit may include a compensation control circuit and a plurality of detection circuits (e.g. four detection circuits), wherein the plurality of detection circuits are connected to auxiliary light emitting units of a plurality of pixel units in one-to-one correspondence. The auxiliary light emitting unit of each pixel unit may emit light according to the detection result of the connected detection circuit under the control of the compensation control circuit, so as to achieve brightness compensation. The present embodiment is not limited to the number of pixel units connected to one compensation circuit.

In some exemplary implementations, the compensation control circuit includes a first control sub-circuit and a second control sub-circuit. The first control sub-circuit is connected to a first scan line, one voltage detection circuit and one detection circuit, and is configured to transmit a detection result of the detection circuit to the voltage detection circuit under the control of the first scan line, so that an external control circuit connected to the voltage detection circuit updates a compensation control signal according to the detection result. The second control sub-circuit is connected with the first scan line, a compensation data line, a second power supply line and at least one detection circuit, and is configured to transmit a compensation control signal provided by the compensation data line to the at least one detection circuit under the control of the first scan line, so as to control the at least one detection circuit to transmit the detection result to the corresponding auxiliary light emitting unit. In some examples, the voltage detection circuit may be configured to acquire a threshold voltage of a drive transistor of the main light emitting unit and to acquire a detection result of the detection circuit. The external control circuit may be integrated within a timing controller to facilitate the provision of a compensation control signal to the compensation data line through a data driver. However, the present embodiment is not limited thereto.

In some exemplary implementations, the compensation circuit may include one detection circuit, wherein the detection circuit is connected to an auxiliary light emitting unit of at least one pixel unit. The detection circuit is configured to detect the temperature of the at least one pixel unit and control the auxiliary light emitting unit of the at least one pixel unit to emit light according to the detection result. In the present exemplary implementation, the detection circuit may achieve a temperature detection and a light emission control of the auxiliary light emitting unit. However, the present embodiment is not limited thereto.

In some exemplary implementations, the main light emitting unit includes a main light emitting element and a main drive circuit; and the auxiliary light emitting unit includes an auxiliary light emitting element and an auxiliary drive circuit. The main light emitting element and the auxiliary light emitting element are both micro light emitting elements. The light emitting area of the main light emitting element is larger than that of the auxiliary light emitting element. In some examples, the main light emitting element and the auxiliary light emitting element may be a Mini Light Emitting Diode (Mini LED for short), or may be a Micro Light Emitting Diode (Micro LED for short). However, the present embodiment is not limited thereto. In this example, the auxiliary light emitting element having a small light emitting area is provided, which may be beneficial to increasing the current density flowing through the auxiliary light emitting element, thereby improving the light emitting efficiency of the auxiliary light emitting element.

In some exemplary implementations, the display substrate includes a base substrate, a circuit structure layer and a plurality of light emitting diode chips arranged on the base substrate. The circuit structure layer includes the compensation circuit and the main drive circuit and the auxiliary drive circuit of the pixel unit. At least one light emitting diode chip includes a main light emitting element and an auxiliary light emitting element of the pixel unit. The main light emitting element and the auxiliary light emitting element each includes a first semiconductor layer, a quantum well layer and a second semiconductor layer stacked in sequence; wherein the doping types of the first semiconductor layer and the second semiconductor layer are different. The main light emitting element and the auxiliary light emitting element each further includes at least one of a first bonding electrode and a second bonding electrode. The first bonding electrode of the main light emitting element is connected to the first semiconductor layer of the main light emitting element, and the second bonding electrode of the main light emitting element is connected to the second semiconductor layer of the main light emitting element. The first bonding electrode of the auxiliary light emitting element is connected to the first semiconductor layer of the auxiliary light emitting element, and the second bonding electrode of the auxiliary light emitting element is connected to the second semiconductor layer of the auxiliary light emitting element. In the present exemplary implementation, the main light emitting element and the auxiliary light emitting element are arranged on one light emitting diode chip, so that the light emitting areas of both the main light emitting element and the auxiliary light emitting element are smaller than the whole area of the light emitting diode chip, which may increase the current density flowing through the main light emitting element and the auxiliary light emitting element, thereby improving the light emitting efficiency of the light emitting diode chip.

Solutions of the embodiment will be described below through some examples.

Figure 2:
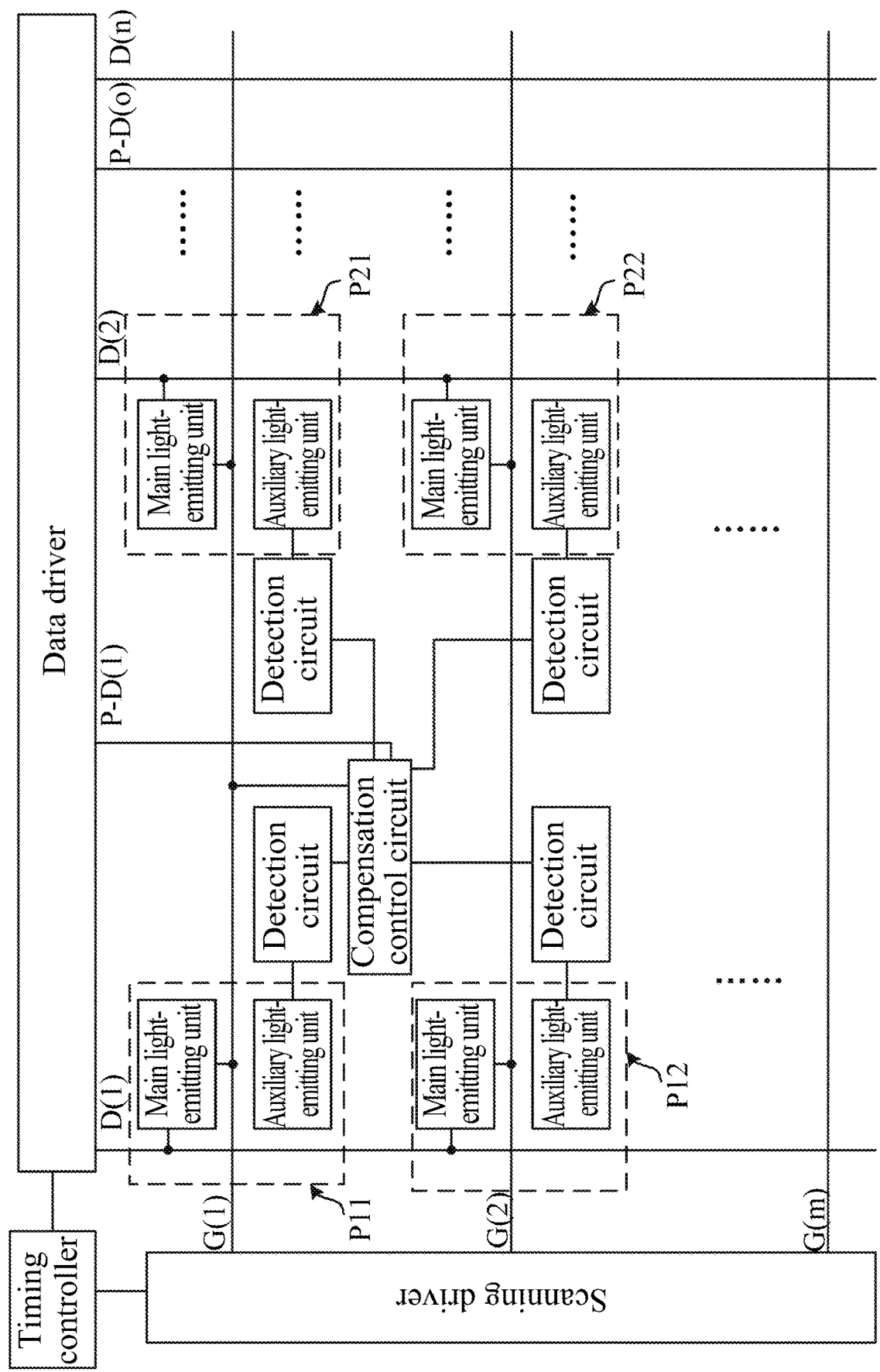
FIG. 2 is a schematic diagram of a structure of a display substrate according to at least one embodiment of the present disclosure.

FIG. 2 is a schematic diagram of a structure of a display substrate according to at least one embodiment of the present disclosure. In some exemplary implementations, as shown in FIG. 2, the display substrate includes a timing controller, a data driver, a scan driver, a pixel array and a plurality of compensation circuits. The pixel array may include a plurality of scan lines (e.g. the G (1) to the G (m)), a plurality of data lines (e.g. the D (1) to the D (n)), a plurality of pixel units, and a plurality of compensation data lines (e.g. the P-D (1) to the P-D (o)), wherein, o, m and n are natural numbers.

In some exemplary implementations, the timing controller may provide a gray scale value and a control signal suitable for the specification of the data driver to the data driver, and may provide a clock signal, a scan start signal, and the like suitable for the specification of the scan driver to the scan driver. The data driver may generate a data voltage to be provided to the data lines D (1) to D (n) using the gray-scale value and control signal received from the timing controller. For example, the data driver may sample the gray-scale value by using a clock signal, and apply the data voltage corresponding to the gray-scale value to the data lines D (1) to D (n) taking pixel unit row as the unit. The data driver may also use the control signal received from the timing controller to generate compensation control signals supplied to the compensation data lines P-D (1) to P-D (o). The scan driver may generate a scan signal to be provided to the scan lines G (1) to G (m) by receiving the clock signal, a scan starting signal, etc., from the timing controller. For example, the scan driver may sequentially provide the scan signals with on-level pulses to the scan lines G (1) to G (m). For example, the scan driver may be constructed in a form of a shift register and may generate a scan signal in a manner of sequentially transmitting a scan start signal provided in a form of an on-level pulse to a next-stage circuit under control of a clock signal. The pixel array may include a plurality of pixel units (e.g. pixel units P11, P12, P21, and P22). Each pixel unit may be connected to a corresponding data line and a corresponding scan line. For example, the pixel unit P11 may be connected to the first data line and the first scan line. In some examples, one compensation data line is connected to one compensation circuit. However, the present embodiment is not limited thereto. For example, one compensation data line may be connected to a plurality of compensation circuits.

In some exemplary implementations, as shown in FIG. 2, at least one pixel unit includes a main light emitting unit and an auxiliary light emitting unit. At least one compensation circuit includes a compensation control circuit and a plurality of detection circuits (e.g. four detection circuits) connected to the compensation control circuit. In some examples, the plurality of detection circuits of the compensation circuit and the auxiliary light emitting units of the plurality of pixel units may be connected in one-to-one correspondence. The detection circuit is configured to detect a brightness of the connected pixel units, and the compensation control circuit is configured to control the auxiliary light emitting units of the plurality of pixel units to emit light according to the detection result of the connected detection circuit, so as to compensate a brightness of the main light emitting unit.

In some exemplary implementations, as shown in FIG. 2, one compensation circuit is connected to four adjacent pixel units (e.g. pixel units P11, P12, P21 and P22). The four detection circuits included by the compensation circuit are connected to the auxiliary light emitting units of the four pixel units in one-to-one correspondence. The compensation circuit is located in the middle of the four pixel units, the compensation control circuit is located in the middle of the four detection circuits, and the compensation control circuit is close to the detection circuit connected to the pixel unit P11. The arrangement of the compensation circuit in this embodiment may facilitate wiring. However, the present embodiment is not limited thereto.

Figure 3:
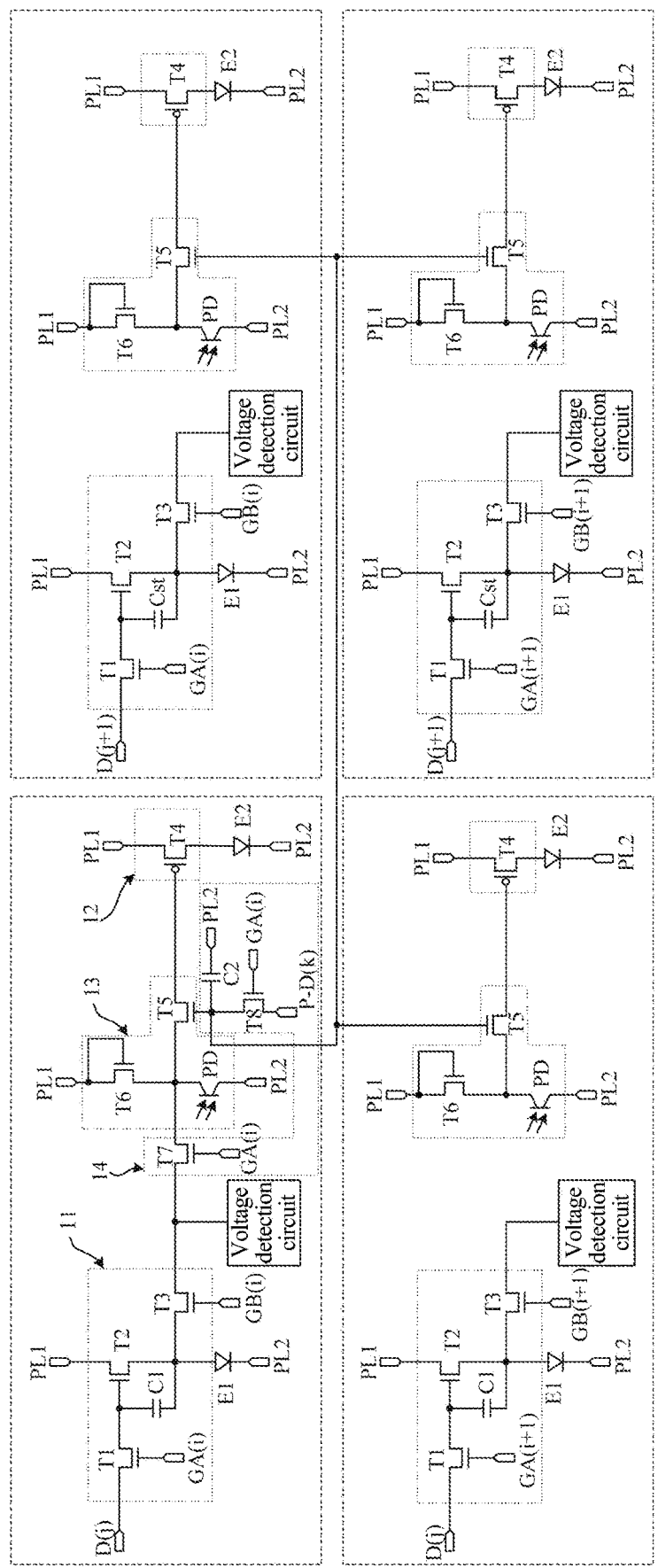
FIG. 3 is a schematic diagram of a circuit structure of a display substrate according to at least one embodiment of the present disclosure.
Figure 4:
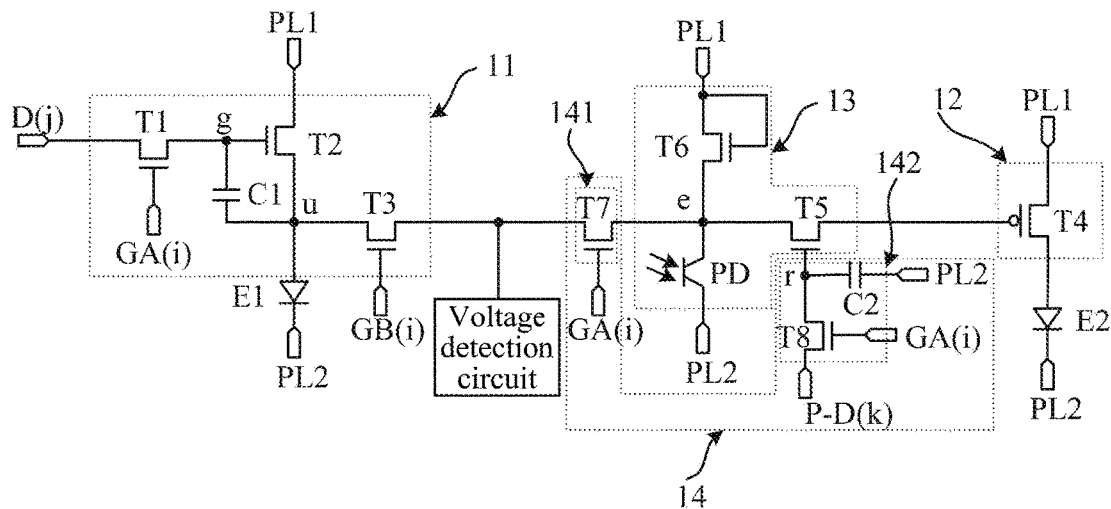
FIG. 4 is a schematic diagram of a partial circuit structure of a display substrate according to at least one embodiment of the present disclosure.

FIG. 3 is a schematic diagram of a circuit structure of a display substrate according to at least one embodiment of the present disclosure. FIG. 4 is a schematic diagram of a partial circuit structure of a display substrate according to at least one embodiment of the present disclosure. Equivalent circuit structures of four pixel units (for example, a pixel unit of row i and column j, a pixel unit of row i and column j+1, and a pixel unit of row i+1 and column j+1), four detection circuits, and one compensation control circuit are illustrated in FIG. 3. The four detection circuits are connected to the four pixel units in one-to-one correspondence, and the compensation control circuit is connected to the four detection circuits. Equivalent circuit structures of one pixel unit (e.g. a pixel unit of row i and column j), one detection circuit and one compensation control circuit are illustrated in FIG. 4, wherein both i and j are integers.

Next, the structure of the pixel unit is illustrated by taking the pixel unit of row i and column j as an example.

In some exemplary implementations, as shown in FIG. 4, the main light emitting unit of the pixel unit of row i and column j may include a main drive circuit 11 and a main light emitting element E1 connected to the main drive circuit 11. The main drive circuit 11 is configured to receive a data voltage transmitted by the data line D (j) under the control of the first scan line GA (i) and to output a corresponding current to the main light emitting element E1. The main light emitting element E1 is configured to emit light with corresponding brightness in response to current output by the main drive circuit 11 of the pixel unit.

In some exemplary implementations, as shown in FIG. 4, the main drive circuit 11 of the pixel unit of the row i and column j may be a pixel circuit in a 3T1C structure. The main drive circuit 11 includes a first transistor T1, a second transistor T2, a third transistor T3, and a first capacitor C1. A control electrode of the first transistor T1 is connected to the first scan line GA (i), a first electrode of the first transistor T1 is connected to the data line D (j), and a second electrode of the first transistor T1 is connected to a control electrode of the second transistor T2. A first electrode of the second transistor T2 is connected to the first power supply line PL1, and a second electrode of the second transistor T2 is connected to the first electrode of the main light emitting element E1. The control electrode of the third transistor T3 is connected to the second scan line GB (i), a first electrode of the third transistor T3 is connected to the second electrode of the second transistor T2, and a second electrode of the third transistor T3 is connected to the voltage detection circuit. A second electrode of the main light emitting element is connected to the second power supply line PL2. A first electrode of the first capacitor C1 is connected to the control electrode of the second transistor T2, and a second electrode of the first capacitor C1 is connected to the first electrode of the main light emitting element E1. In this example, a potential of the first node g is the same as potentials of the control electrode of the second transistor T2, the second electrode of the first transistor T1 and the first electrode of the first capacitor C1. The potential of the second node u is the same as potentials of the second electrode of the second transistor T2, the second electrode of the first capacitor C1, the second electrode of the third transistor T3, and the first electrode of the main light emitting element E1. In this example, the first transistor T1 may also be referred to as an input transistor, the second transistor T2 may also be referred to as a drive transistor, and the third transistor T3 may also be referred to as a sense transistor. The present embodiment is not limited to the number of transistors and the number of capacitors included in the main drive circuit.

In some exemplary implementations, the first transistor T1 to the third transistors T3 may be N-type transistors. However, the present embodiment is not limited thereto.

In some exemplary implementations, as shown in FIG. 4, the auxiliary light emitting unit of the pixel unit of row i and column j includes an auxiliary drive circuit 12 and an auxiliary light emitting element E2 connected to the auxiliary drive circuit 12. The auxiliary drive circuit 12 is connected to the detection circuit 13. The auxiliary drive circuit 12 is configured to output a corresponding current to the auxiliary light emitting element E2 under the control of the detection circuit 13. The auxiliary light emitting element E2 is configured to emit light with corresponding brightness in response to the current output by the auxiliary drive circuit 12 to compensate the brightness of the main light emitting unit.

In some exemplary implementations, as shown in FIG. 4, the auxiliary drive circuit 12 of the pixel unit of row i and column j includes a fourth transistor T4. A control electrode of the fourth transistor T4 is connected to the detection circuit 13, a first electrode of the fourth transistor T4 is connected to the first power supply line PL1, and a second electrode of the fourth transistor T4 is connected to the first electrode of the auxiliary light emitting element E2. A second electrode of the auxiliary light emitting element is connected to the second power supply line PL2. In some examples, the fourth transistor T4 may be a P-type transistor. However, the present embodiment is not limited thereto.

In some exemplary implementations, as shown in FIG. 4, the detection circuit 13 is connected to the auxiliary drive circuit 12 of the pixel unit of row i and column j, and a compensation control circuit 14. The detection circuit 13 is configured to detect the light emitting brightness of the pixel unit of row i and column j, and outputs a detection result to the auxiliary drive circuit 12 under the control of the compensation control circuit 14 to control the auxiliary light emitting element E2 to emit light with a corresponding brightness.

In some exemplary implementations, as shown in FIG. 3, one compensation control circuit 14 is connected to four detection circuits 13. Four detection circuits 13 are connected to four pixel units (i.e., a pixel unit of row i and column j, a pixel unit of row i and column j+1, a pixel unit of row i+1 and column j and a pixel unit of row i+1 and column j+1) in one-to-one correspondence. The compensation control circuit 14 is also connected to a voltage detection circuit connected to the pixel unit of row i and column j. The voltage detection circuit connected to the pixel units of row i and column j is configured to extract a threshold voltage of a drive transistor of the main drive circuit 11, and is also configured to acquire a detection result of the detection circuit 13, so that an external control circuit determines whether or not to perform a brightness compensation for the four pixel units connected to the compensation circuit according to the result. The voltage detection circuit connected to the other pixel units except the pixel unit of row i and column j in the aforementioned four pixel units is only configured to extract the threshold voltage of the drive transistor of the corresponding main drive circuit to compensate for the threshold voltage. The compensation control circuit 14 is also connected to the first scan line GA (i) and the compensation data line P-D (k). The compensation control circuit 14 is configured to control the detection circuit 13 to output a detection result to the correspondingly connected auxiliary drive circuit 12 according to a compensation control signal supplied by the compensation data line P-D (k), so that the corresponding auxiliary light emitting element E2 emits light with the corresponding brightness according to the detection result.

In some exemplary implementations, as shown in FIG. 4, the detection circuit 13 connected to the pixel unit of row i and column j includes a fifth transistor T5, a sixth transistor T6 and a detection element PD. A first electrode of the detection element PD is connected to a second electrode of the sixth transistor T6, and a second electrode of the detection element PD is connected to the second power supply line PL2. A control electrode and a first electrode of the sixth transistor T6 are both connected to the first power supply line PL1. A control electrode of the fifth transistor T5 is connected to the compensation control circuit 14, a first electrode of the fifth transistor T5 is connected to the second electrode of the sixth transistor T6, and a second electrode of the fifth transistor T5 is connected to the auxiliary drive circuit 12. In this example, the second electrode of the fifth transistor T5 may be connected to the control electrode of the fourth transistor T4 of the auxiliary drive circuit 12. In this example, a potential of the third node e is the same as the potentials of the first electrode of the detection element PD, the second electrode of the sixth transistor T6, the first electrode of the fifth transistor T5, and the second electrode of the seventh transistor T7. In some examples, the fifth transistor T5 and the sixth transistor T6 may be N-type transistors. However, the present embodiment is not limited thereto.

In some exemplary implementations, the detection element PD may be a PIN-type photodiode. Under an illumination condition, the PIN-type photodiode may generate corresponding electrical signals according to the sensed optical signals. For example, the PIN-type photodiode may include a stacked second electrode (e.g. a cathode), a photoelectric conversion structure, and a first electrode (e.g. an anode). However, the present embodiment is not limited thereto.

In some exemplary implementations, as shown in FIG. 4, the compensation control circuit 14 includes a first control sub-circuit 141 and a second control sub-circuit 142. The first control sub-circuit 141 is connected to the first scan line GA (i), and the voltage detection circuit and the detection circuit 13 connected to the pixel units of row i and column j, and is configured to transmit a detection result of the detection circuit 13 to the voltage detection circuit under the control of the first scan line GA (i), so that the external control circuit connected to the voltage detection circuit updates a compensation control signal according to the detection result. The second control sub-circuit 142 is connected to the first scan line GA (i), the compensation data line P-D (k), the second power supply line PL2, and the four detection circuits 13, and is configured to transmit a compensation control signal supplied from the compensation data line P-D (k) to the four detection circuits 13 under the control of the first scan line GA (i) to control the four detection circuits 13 to transmit the detection results to corresponding auxiliary light emitting units, respectively, wherein k is an integer. In this example, it is judged whether brightness compensation is performed or not by using the detection result of one detection circuit, and after determining that brightness compensation is performed, four auxiliary light emitting elements may be simultaneously controlled to perform the brightness compensation.

In some exemplary implementations, as shown in FIG. 4, the first control sub-circuit 141 of the compensation control circuit 14 may include a seventh transistor T7; and the second control sub-circuit 142 may include an eighth transistor T8 and a second capacitor C2. A control electrode of the seventh transistor T7 is connected to the first scan line GA (i), a first electrode of the seventh transistor T7 is connected to one voltage detection circuit, and a second electrode of the seventh transistor T7 is connected to one detection circuit 13. A control electrode of the eighth transistor T8 is connected to the first scan line GA (i), a first electrode of the eighth transistor T8 is connected to the compensation data line P-D (k), and a second electrode of the eighth transistor T8 is connected to the four detection circuits 13. A second electrode of the second capacitor C2 is connected to the second electrode of the eighth transistor T8, and a first electrode of the second capacitor C2 is connected to the second power supply line PL2. In this example, the first electrode of the seventh transistor T7 is connected to a first electrode of a detection element PD of one detection circuit 13; and the eighth transistor T8 is connected to the control electrodes of the fifth transistors T5 of the four detection circuits 13. In this example, a potential of the fourth node r is the same as potentials of the second electrode of the second capacitor C2, the second electrode of the eighth transistor T8, and the control electrodes of the fifth transistors T5 of the four detection circuits. In some examples, the seventh transistor T7 and the eighth transistor T8 may be N-type transistors. However, the present embodiment is not limited thereto.

In some exemplary implementations, the first power supply line PL1 may keep providing high-level signals, and the second power supply line PL2 may keep providing low-level signals. The first transistor T1 to the eighth transistor T8 may adopt low temperature poly-silicon thin film transistors, or may adopt oxide thin film transistors, or may adopt a low temperature poly-silicon thin film transistor(s) and an oxide thin film transistor(s). The active layer of the low temperature poly-silicon thin film transistor is made of Low Temperature Poly-Silicon (LTPS), and the active layer of the oxide thin film transistor is made of an oxide (Oxide). The low temperature poly silicon thin film transistor has advantages of a high mobility rate, fast charging, and the like, and the oxide thin film transistor has advantages of a low leakage current and the like. In some exemplary implementations, the low temperature poly-silicon thin film transistors and the oxide thin film transistors may be integrated on one display substrate to form a Low Temperature Polycrystalline Oxide (LTPO) display substrate. Advantages of the low temperature poly-silicon thin film transistor and the oxide thin film transistor may be used to achieve high Pixel Per Inch (PPI) and low frequency driving, so that power consumption may be reduced, and display quality may be improved.

Figure 5:
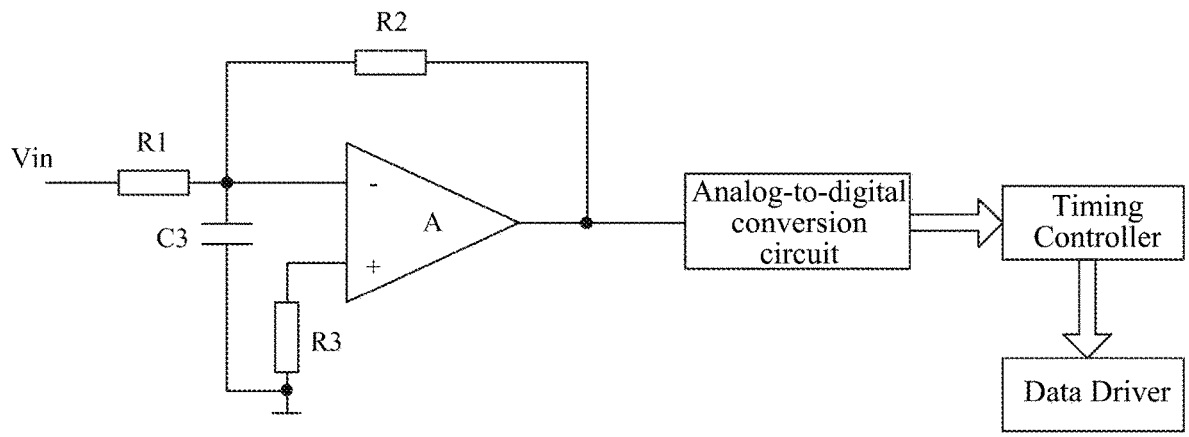
FIG. 5 is a schematic diagram of a structural of a voltage detection circuit according to at least one embodiment of the present disclosure.

FIG. 5 is a schematic diagram of a structural of a voltage detection circuit according to at least one embodiment of the present disclosure. In some exemplary implementations, as shown in FIG. 5, the voltage detection circuit may include a filter amplification circuit and an analog-to-digital (A/D) conversion circuit. An input terminal Vin of the filter amplification circuit may be connected to the second electrode of the third transistor T3 of the main drive circuit of one pixel cell. An output terminal of the filter amplification circuit may be connected with the analog-to-digital conversion circuit.

In some exemplary implementations, the filter amplification circuit may include a comparator A, a third capacitor C3, a first resistor R1, a second resistor R2, and a third resistor R3. A first terminal of the first resistor R1 is connected to the input terminal Vin of the filter amplification circuit, and a second terminal of the first resistor R1 is connected to a first input terminal of the comparator A. A first electrode of the third capacitor C3 is connected to the first input terminal of the comparator A, and a second electrode of the third capacitor C3 is connected to a ground terminal. A first terminal of the third resistor R3 is connected to a second input terminal of the comparator A, and a second terminal of the third resistor R3 is connected to the ground terminal. A first terminal of the second resistor R2 is connected to the first input terminal of the comparator A, and a second terminal of the second resistor R2 is connected to an output terminal of the comparator A. The output terminal of the comparator A is connected with the analog-to-digital conversion circuit.

In some exemplary implementations, the threshold voltage of the drive transistor (i.e., the second transistor T2) of the main drive circuit of the main drive circuit may be extracted after the electrical signal output by the third transistor T3 of the main drive circuit of the pixel unit is converted by the voltage detection circuit. The extracted threshold voltage may be transmitted to a timing controller, which compensates the data voltage by using the threshold voltage to obtain a compensated data signal and supplies the compensated data signal to a data driver, so that the data driver supplies the compensated data signal to the pixel unit through a data line. The present exemplary embodiment uses a main drive circuit and a voltage detection circuit to achieve the threshold compensation by an external compensation method to improve the display effect.

In some exemplary implementations, the electrical signal output by the seventh transistor T7 of the compensation control circuit 14 is a electrical signal converted by the detection element PD of the detection circuit 13 according to the received optical signal. After the electrical signal output by the seventh transistor T7 of the compensation control circuit 14 is converted by the voltage detection circuit, the corresponding voltage value may be extracted. The extracted voltage value may be transmitted to a timing controller, and the timing controller judges whether brightness compensation is required. For example, when the extracted voltage value does not coincide with the display gray-scale voltage value of the pixel unit (for example, the extracted voltage value is greater than the display gray-scale voltage value), the timing controller determines that brightness compensation is required for the pixel unit. The timing controller may provide a control signal to the data driver, so that the data driver provides a compensation control signal to the compensation control circuit through the compensation data line. The compensation control circuit may turn on the fifth transistor T5 of the detection circuit 13 by using the compensation control signal, so that the detection circuit 13 controls the auxiliary light emitting element E2 to emit light with a corresponding brightness by using the detection result. Among them, after the fifth transistor T5 is turned on, the control electrode of the fourth transistor T4 of the auxiliary drive circuit 12 is controlled by the third node e, and the potential of the third node e is controlled by the detection result of the detection element PD of the detection circuit 13.

Figure 6:
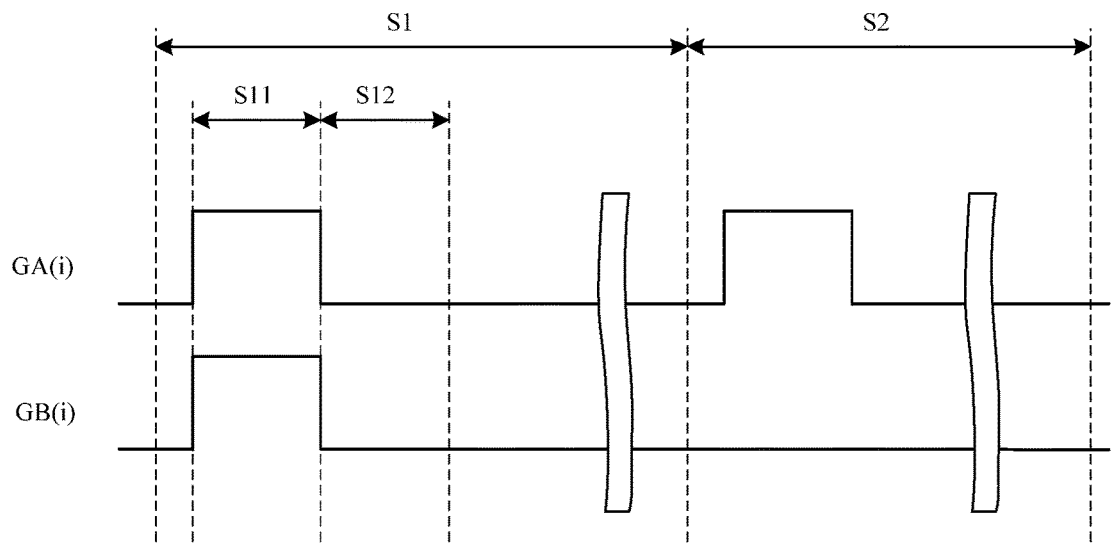
FIG. 6 is a working timing diagram of a main drive circuit of a pixel unit according to at least one embodiment of the present disclosure.

FIG. 6 is a working timing diagram of a main drive circuit of a pixel unit according to at least one embodiment of the present disclosure. In some exemplary implementations, the main drive circuit of the pixel unit of row i and column j is illustrated as an example. As shown in FIG. 4 and FIG. 6, the operation process of the main drive circuit of the pixel unit of row i and column j includes an idle stage S1 and a display stage S2. In the idle stage S1 between each two-frame display stages S2, a threshold compensation operation for a row of pixel units may be completed, for example, detection of a threshold voltage Vth and a mobility of a drive transistor of a main drive circuit of a row of pixel units may be completed, so as to obtain a compensation data signal in the display stage S1 by using the detected data to complete the display.

In some exemplary implementations, as shown in FIG. 4 and FIG. 6, the idle phase S1 includes a first phase S11 and a second phase S12.

In the first stage S11, the first scan line GA (i) and the second scan line GB (i) provide high-level signals, and the first transistor T1 and the third transistor T3 are turned on. The first transistor T1 is turned on, and the data voltage supplied by the data line D (j) is transmitted to the first node g, such that the potential of the first node g is the data voltage Vdata. The third transistor T3 is turned on, and the reset voltage is transmitted to the second node u, such that the potential of the second node u is the reset voltage Vref. Thereafter, under the control of the potential of the first node g, the second transistor T2 is turned on. The first power supply line PL1 charges the second node u through the second transistor T2. The voltage detection circuit may store the potential of the second node u.

In the second stage S12, the first scan line GA (i) and the second scan line GB (i) provide low-level signals, and the first transistor T1 and the third transistor T3 are turned off. The second transistor T2 is turned on, and after charging the second node u to Vdata-Vth, the second transistor T2 is turned off, wherein Vth is the threshold voltage of the third transistor T2.

In some exemplary implementations, the voltage Vdata-Vth of the second node u may be read by using the voltage detection circuit, and since the data voltage Vdata is known, the threshold voltage Vth of the second transistor T2 may be obtained accordingly, and the threshold voltage Vth may be stored for subsequent threshold compensation use.

In some exemplary implementations, the extraction process of the threshold voltage of the drive transistor (i.e., the second transistor) of the main drive circuit is performed in the idle phase, for example, may be performed before the display apparatus is started, or may be performed after the display apparatus is turned off. However, this embodiment is not limited thereto.

In some exemplary implementations, as shown in FIG. 4 and FIG. 6, in the display stage S2, the timing controller may determine that the compensated data voltage is Vdata'+Vth according to the stored and extracted threshold voltage and the data voltage Vdata' of the drive transistor, and supply the compensated data voltage to the pixel unit through the data driver and the data line.

In some exemplary implementations, in the data write stage of the display phase S2, the first scan line GA (i) provides a high-level signal, the first transistor T1 is turned on, and the data voltage provided by the data line D (j) is transmitted to the first node g, such that the potential of the first node g is Vdata'+Vth. The second scan line GB (i) provides a low-level signal, and the third transistor T3 is turned off. In the light emitting stage of the display stage S2, the first scan line GA (i) and the second scan line GB (i) provide low-level signals, and the first transistor T1 and the third transistor T3 are turned off. Under the control of the potential of the first node g, the second transistor T2 is turned on. The first power supply line PL1 supplies a drive current to the second node u through the second transistor T2.

In this example, the drive current flowing through the main light emitting element E1 may be:

$$I = K(Vgs - Vth)^2 = K(Vdata' + Vth - Vdd - Vth)^2 = K(Vdata' - Vdd)^2;$$

wherein K is a constant related to the process parameters and geometric dimensions of the drive transistor; Vdata' is the data voltage, and Vdd is the first power supply voltage supplied by the first power supply line PL1.

It may be seen that the drive current of the main light emitting element is independent of the threshold voltage of the second transistor T2, thereby ensuring stable display of the main light emitting element. The present example may achieve the external compensation of the threshold voltage.

In some exemplary implementations, the detection circuit connected to the pixel unit is configured to detect the light emitting brightness of the corresponding pixel unit and transmit the detection result to the voltage detection circuit in the display stage.

Figure 7:
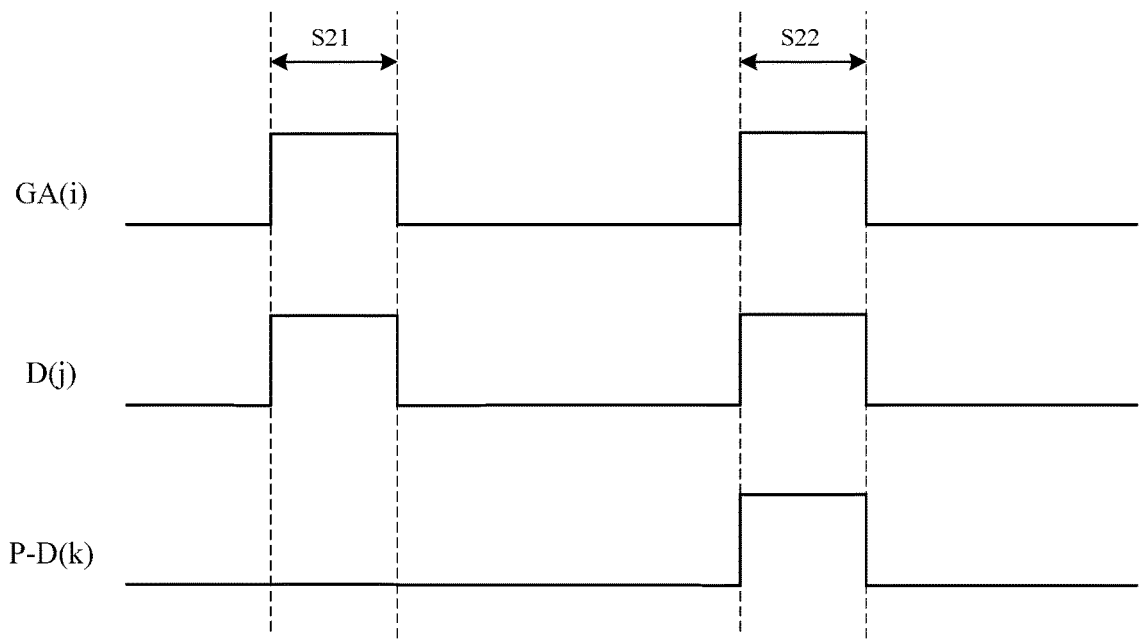
FIG. 7 is a working timing diagram of a compensation control circuit according to at least one embodiment of the present disclosure.

FIG. 7 is a working sequence diagram of a drive control circuit according to at least one embodiment of the present disclosure. In some exemplary implementations, as shown in FIG. 4 and FIG. 7, the compensation control circuit 14 may extract the detection result in one-frame display stage (i.e., the brightness detection stage S21), and control the auxiliary light emitting element E2 to emit light for the brightness compensation in the subsequent one-frame display stage (i.e., the brightness compensation stage S22).

In the brightness detection stage S21, the first scan line GA (i) supplies a high-level signal, and the seventh transistor T7 and the eighth transistor T8 of the compensation control circuit 14 are turned on. The detection element PD of the detection circuit 13 senses an optical signal emitted from the pixel unit of the row i and the column j and converts the optical signal into an electrical signal. Among them, the higher the brightness of the optical signal sensed by the detection element PD, the lower the potential of the third node e. The seventh transistor T7 is turned on, and the voltage detection circuit may extract the voltage value to the third node e and supply it to the timing controller. The timing controller may judge whether brightness compensation is required for the pixel unit according to the voltage value of the third node e. In this example, in the display stage, when the first scan line GA (i) supplies a high-level signal, the second scan line GB (i) supplies a low-level signal, so when the seventh transistor T7 is turned on, the third transistor T3 of the main drive circuit 11 is turned off, and the main drive circuit 11 does not affect the voltage detection circuit to extract the voltage value of the third node e. In the brightness detection stage S21, the compensation data line P-D (k) supplies a low-level signal, the eighth transistor T8 is turned on, so that the fourth node r is at a low potential, the fifth transistor T5 of the detection circuit 13 is turned off, and the auxiliary light emitting element E2 does not emit light.

In some examples, when the data voltage corresponds to 255 gray scales, the potential of the third node e is the first voltage value in theory. When the actual voltage value of the third node e read by the voltage detection circuit is greater than the first voltage value, the brightness of the optical signal detected by the detection element PD is lower than 255 gray scales. At this time, the timing controller determines that brightness compensation is required, and supplies a compensation control signal which is a high-level signal in the next scan stage to the compensation data line P-D (k) through the data driver. When the brightness of the optical signal detected by the detection element PD coincides with the brightness corresponding to the data voltage, the timing controller may supply a compensation control signal with the low-level signal to the compensation data line P-D (k) through the data driver, so that the eighth transistor T8 of the compensation control circuit 14 is turned off, that is, no brightness compensation is performed.

In the brightness compensation stage S22, the first scan line GA (i) supplies a high-level signal, and the seventh transistor T7 and the eighth transistor T8 are turned on. The compensation data line P-D (k) supplies a high-level signal, and writes the high-level signal to the fourth node r, so that the fifth transistor T5 is turned on. At this time, the potential of the control electrode of the fourth transistor T4 is controlled by the third node e. In this way, the light emitting brightness of the auxiliary light emitting element E2 may be controlled according to the real-time detection result of the detection element PD to provide a real-time variable compensation brightness.

In the present exemplary implementation, in the brightness compensation stage S22, the potential of the control electrode of the fourth transistor T4 of the auxiliary drive circuit 12 is controlled by the detection element PD. The lower the brightness of the optical signal detected by the detection element PD, the lower the brightness required to be compensated. The lower the brightness of the optical signal detected by the detection element PD, the higher the resistance value of the detection element PD and the higher the voltage value of the third node e, the smaller the gate-source voltage difference Vgs of the fourth transistor T4 and the smaller the drive current supplied to the auxiliary light emitting element E2. The brightness of the auxiliary light emitting element E2 of this example conforms to the trend that the lower the gray-scale display, the lower the brightness to be compensated. In this example, the brightness required to be compensated by the pixel unit is associated with the brightness displayed by the pixel unit, and the lower the brightness displayed by the pixel unit, the lower the brightness required to be compensated.

Figure 8:
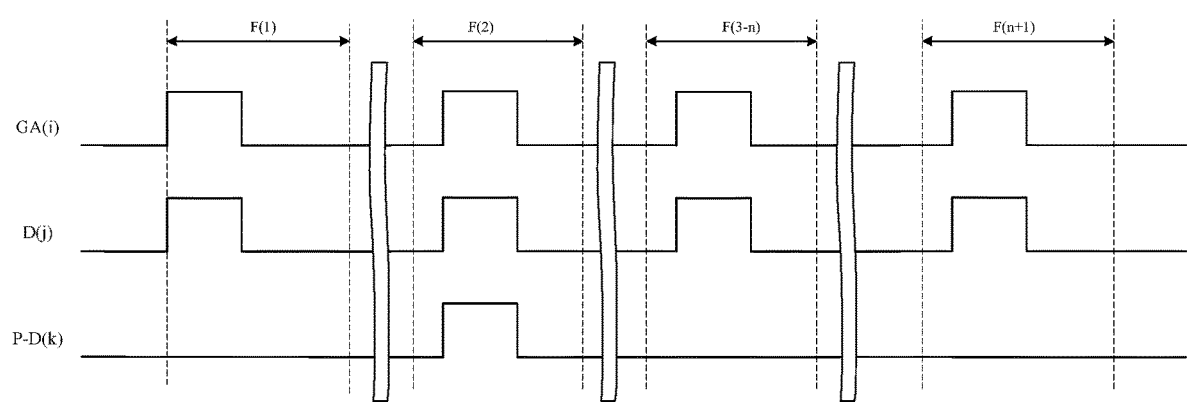
FIG. 8 is a working timing diagram of a compensation control circuit in a multi-frame display stage according to at least one embodiment of the present disclosure.

FIG. 8 is a working timing diagram of a compensation control circuit in a multi-frame display stage according to at least one embodiment of the present disclosure. In some exemplary implementations, as shown in FIG. 8, the display substrate detects the brightness of the pixel units by the detection element PD in the first frame display stage F (1), and determines that a plurality of pixel units require brightness compensation according to the detection result. In the second frame display stage F (2), a high-level signal supplied by the compensation data line P-D (k) controls a plurality of auxiliary light emitting elements E2 to emit light according to the detection results of corresponding detection elements PD, so as to achieve the brightness compensation. After n frames have passed, it is possible to re-use the detection result of the detection element PD in the (n+1)-th frame display stage F (n+1) to judge whether the brightness compensation is performed or not. This embodiment is not limited to a time point for the brightness detection and a time point for the brightness compensation. In some examples, if it is determined that a brightness compensation is required in the (n+1)-th frame display stage according to the detection result of the detection element PD, the brightness compensation may be performed in the (n+x)-th frame display stage, wherein x, for example, may be an integer greater than 2. Since the temperature does not have a sudden drop, the brightness attenuation caused by temperature rise may still be improved by the brightness compensation after spacing multiple display frames.

The display substrate provided in the exemplary embodiment performs the brightness detection by using a detection element, and controls the auxiliary light emitting element to provide a corresponding compensated brightness according to the detection result, thereby improving the brightness attenuation caused by a temperature rise of the display substrate.

In some exemplary implementations, the display substrate includes a base substrate, a circuit structure layer and a plurality of light emitting diode chips arranged on the base substrate. The circuit structure layer may include a compensation circuit, and a main drive circuit and an auxiliary drive circuit of the pixel unit. At least one light emitting diode chip may include a main light emitting element and an auxiliary light emitting element of one pixel unit. The main light emitting element and the auxiliary light emitting element each include a first semiconductor layer, a multiple quantum well (MQW for short) layer and a second semiconductor layer which are stacked in sequence. The doping types of the first semiconductor layer and the second semiconductor layer are different.

In some exemplary implementations, the light emitting diode chip may be a sub-millimeter light emitting diode (Mini LED) chip or may be a micro light emitting diode (Micro LED) chip. In some examples, the light-emitting diode chip may be a formal-mounted structure, a vertical structure, or a flip-mounted structure. However, this embodiment is not limited thereto.

Figure 9A:
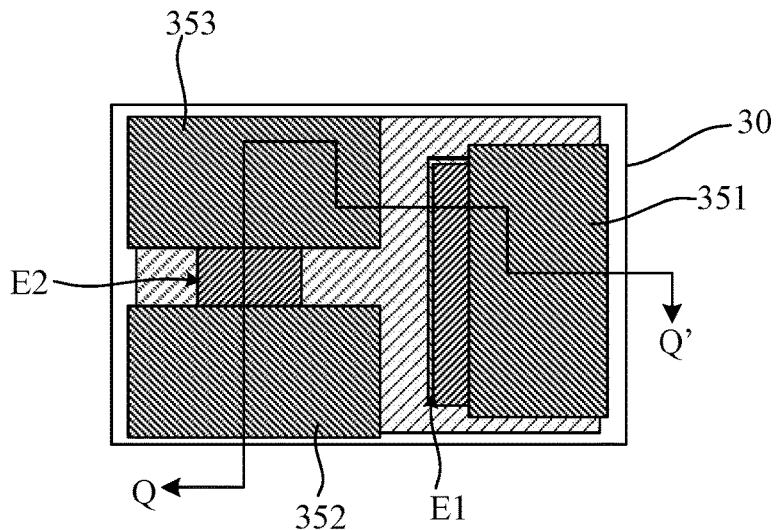
FIG. 9A is a planar schematic diagram of a light emitting diode chip according to at least one embodiment of the present disclosure.
Figure 9B:
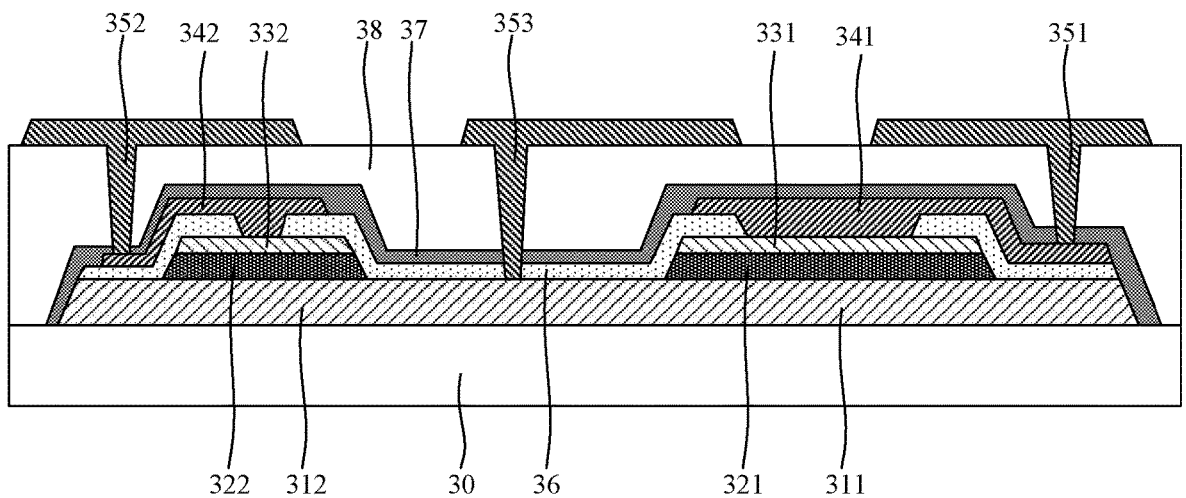
FIG. 9B is a schematic partial sectional view along a Q-Q' direction in FIG. 9A.
Figure 10A:
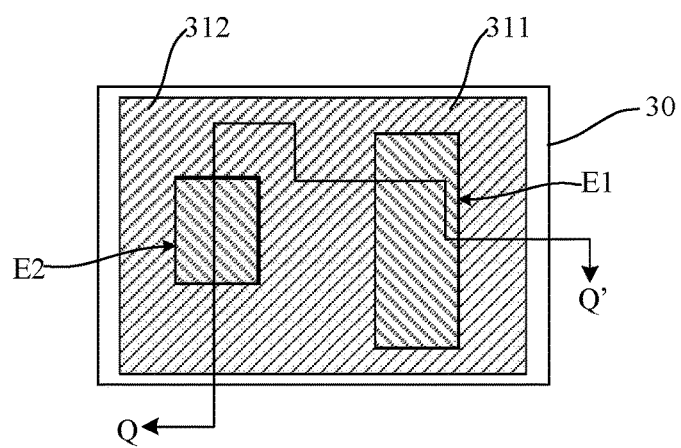
FIG. 10A is a planar schematic diagram of a light emitting diode chip after forming a second semiconductor layer according to at least one embodiment of the present disclosure.
Figure 10B:
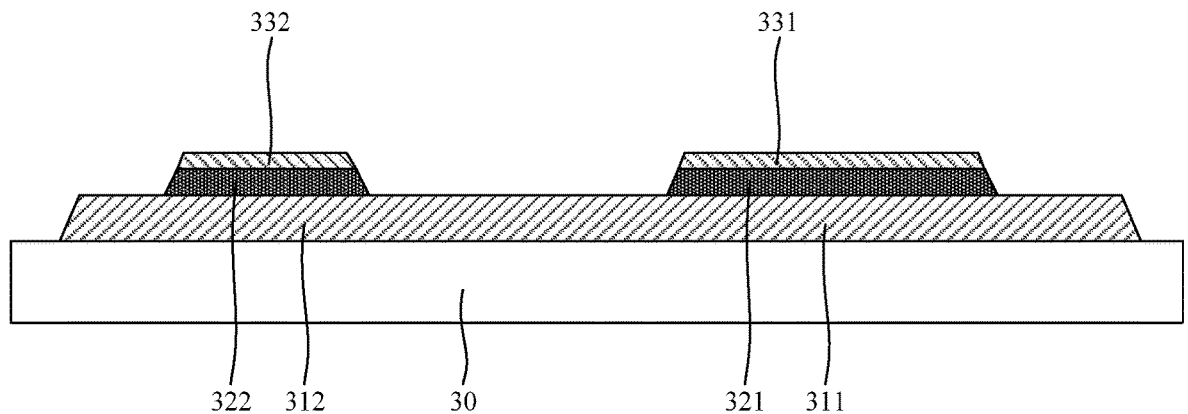
FIG. 10B is a schematic partial sectional view along a Q-Q' direction in FIG. 10A.
Figure 11A:
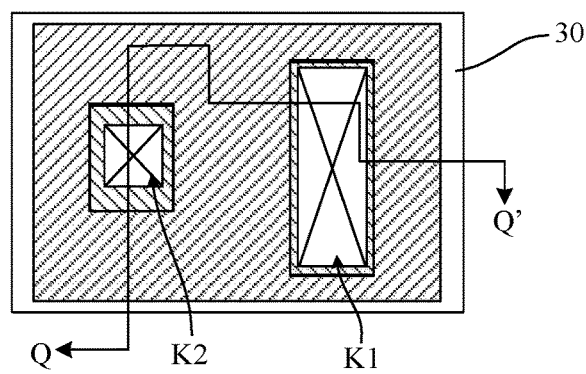
FIG. 11A is a planar schematic diagram of a light emitting diode chip after forming a first insulation layer according to at least one embodiment of the present disclosure.
Figure 11B:
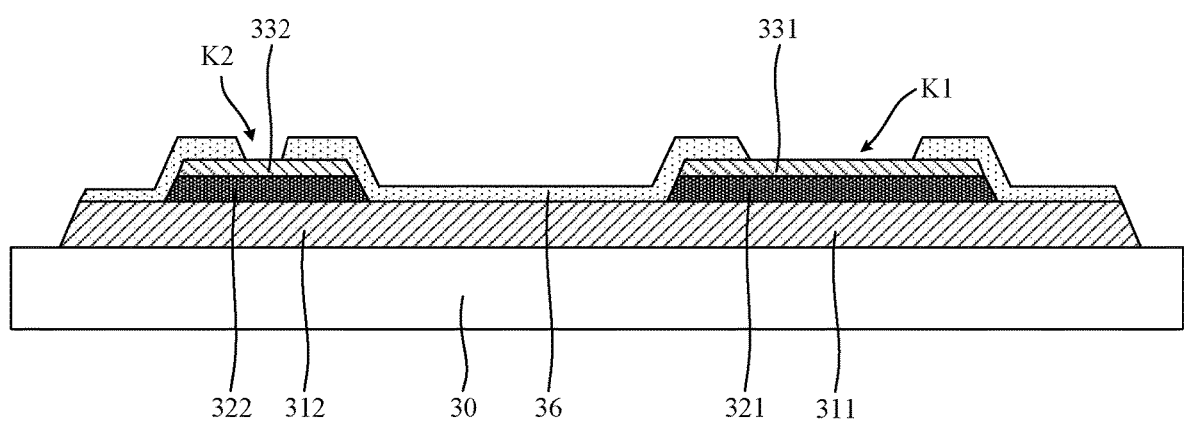
FIG. 11B is a schematic partial sectional view along a Q-Q' direction in FIG. 11A.
Figure 12A:
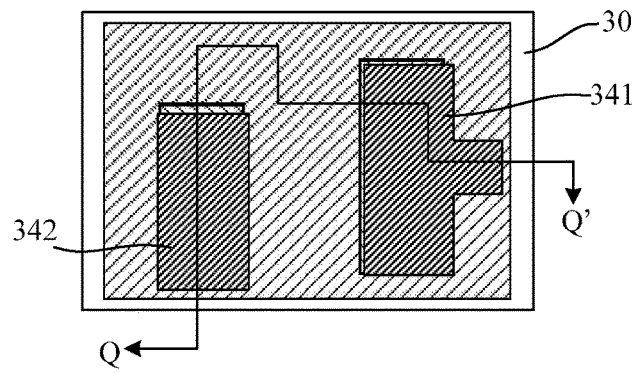
FIG. 12A is a planar schematic diagram of a light emitting diode chip after forming a transfer electrode layer according to at least one embodiment of the present disclosure.
Figure 12B:
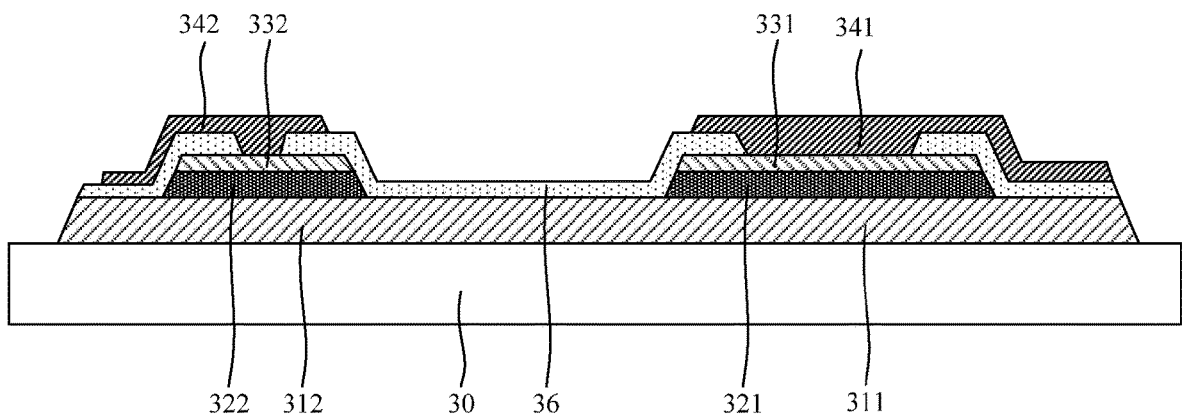
FIG. 12B is a schematic partial sectional view along a Q-Q' direction in FIG. 12A.
Figure 13A:
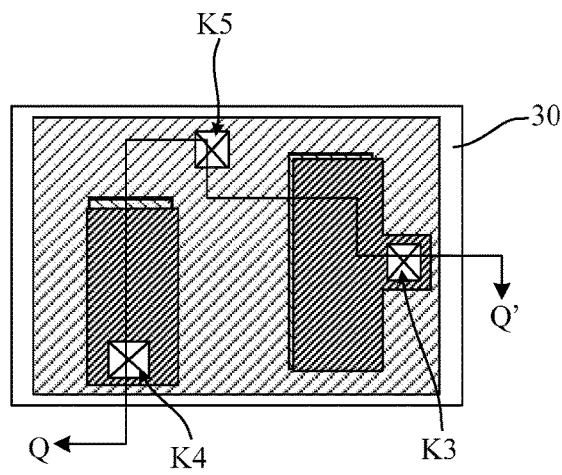
FIG. 13A is a planar schematic diagram of a light emitting diode chip after forming an encapsulation layer according to at least one embodiment of the present disclosure.
Figure 13B:
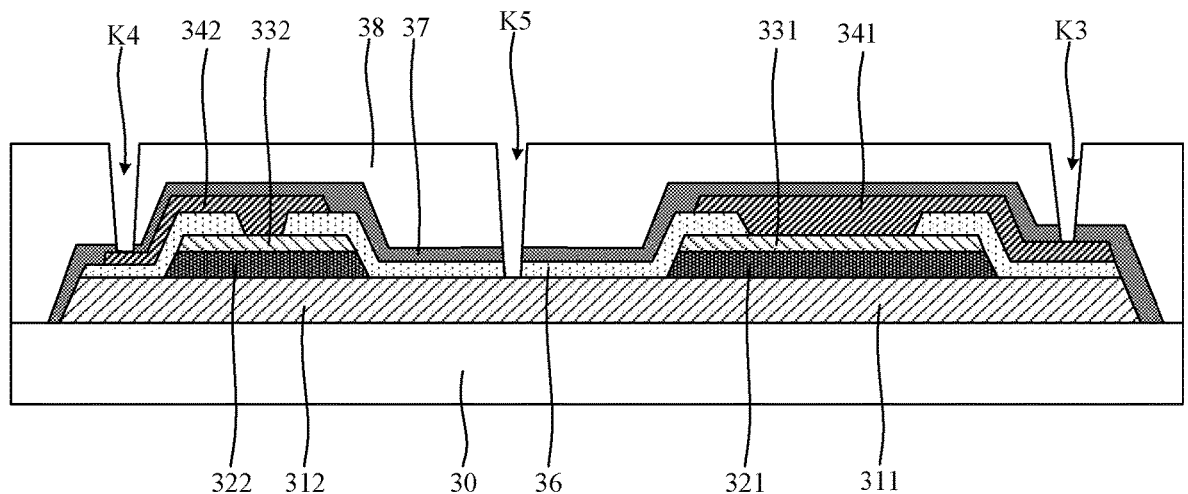
FIG. 13B is a schematic partial sectional view along a Q-Q' direction in FIG. 13A.

FIG. 9A is a planar schematic diagram of a light emitting diode chip according to at least one embodiment of the present disclosure. FIG. 9B is a schematic partial sectional view along a Q-Q' direction in FIG. 9A. FIG. 10A is a planar schematic diagram of a light emitting diode chip after forming a second semiconductor layer according to at least one embodiment of the present disclosure. FIG. 10B is a schematic partial sectional view along a Q-Q' direction in FIG. 10A. FIG. 11A is a schematic plan view of a light emitting diode chip after forming a first insulation layer according to at least one embodiment of the present disclosure. FIG. 11B is a schematic partial sectional view along a Q-Q' direction in FIG. 11A. FIG. 12A is a planar schematic diagram of a light emitting diode chip after forming a transfer electrode layer according to at least one embodiment of the present disclosure. FIG. 12B is a schematic partial sectional view along a Q-Q' direction in FIG. 12A. FIG. 13A is a planar schematic diagram of a light emitting diode chip after forming an encapsulation layer according to at least one embodiment of the present disclosure. FIG. 13B is a schematic partial sectional view along a Q-Q' direction in FIG. 13A. This example is illustrated by taking the structure of the light emitting diode chip as a flip-mounted structure as an example.

In some exemplary implementations, as shown in FIG. 9 to FIG. 13B, the light emitting diode chip may include a underlay substrate 30, and a main light emitting element E1 and an auxiliary light emitting element E2 located on the same side of the underlay substrate 30. That is, the main light emitting element E1 and the auxiliary light emitting element E2 belong to the same light emitting diode chip. The main light emitting element E1 includes a first semiconductor layer 311, a quantum well layer 321, and a second semiconductor layer 331 which are stacked in sequence. The auxiliary light emitting element E2 includes a first semiconductor layer 312, a quantum well layer 322, and a second semiconductor layer 332 which are stacked in sequence. Among them, the first semiconductor layer 311 and the quantum well layer 321 of the main light emitting element E1 may be in direct contact, and the quantum well layer 321 and the second semiconductor layer 331 may be in direct contact. The first semiconductor layer 312 and the quantum well layer 322 of the auxiliary light emitting element E2 may be in direct contact, and the quantum well layer 322 and the second semiconductor layer 332 may be in direct contact. The first semiconductor layer 311 of the main light emitting element E1 and the first semiconductor layer 312 of the auxiliary light emitting element E2 may be of an integral structure. There is a gap between the quantum well layer 321 of the main light emitting element E1 and the quantum well layer 322 of the auxiliary light emitting element E2. There is a gap between the second semiconductor layer 331 of the main light emitting element E1 and the second semiconductor layer 332 of the auxiliary light emitting element E2. In this example, the main light emitting element E1 and the auxiliary light emitting element E2 are provided independently of each other, which facilitates flexible controls of the light emitting states of the main light emitting element E1 and the auxiliary light emitting element E2.

In some exemplary implementations, as shown in FIG. 9 to FIG. 13B, the light emitting region of the main light emitting element E1 is an overlapping region of the first semiconductor layer 311, the quantum well layer 321, and the second semiconductor layer 331 in the stacking direction, and the area of the overlapping region of the first semiconductor layer 311, the quantum well layer 321, and the second semiconductor layer 331 in the stacking direction is a light emitting area of the main light emitting element E1. The light emitting region of the auxiliary light emitting element E2 is an overlapping region of the first semiconductor layer 312, the quantum well layer 322, and the second semiconductor layer 332 in the stacking direction, and the area of the overlapping region of the first semiconductor layer 312, the quantum well layer 322, and the second semiconductor layer 332 in the stacking direction is a light emitting area of the auxiliary light emitting element E2. In this example, the light emitting area of the main light emitting element E1 is larger than the light emitting area of the auxiliary light emitting element E2. The light emitting area of both the main light emitting element E1 and the auxiliary light emitting element E2 is less than the whole area of the light emitting diode chip, so that the current density flowing through the main light emitting element E1 and the auxiliary light emitting element E2 may be improved, and the light emitting efficiency may be improved.

In some exemplary implementations, as shown in FIG. 9 to FIG. 13B, the light emitting diode chip further includes a transfer electrode layer and a bonding electrode layer. The transfer electrode layer is located on a side of the second semiconductor layer away from the underlay substrate 30, and the bonding electrode layer is located on a side of the transfer electrode layer away from the underlay substrate 30. A first insulation layer 36 is provided between the second semiconductor layer and the transfer electrode layer, and a second insulation layer 37 and a encapsulation layer 38 are provided between the transfer electrode layer and the bonding electrode layer. The encapsulation layer 38 is located on a side of the second insulation layer 37 away from the transfer electrode layer.

In some exemplary implementations, as shown in FIG. 9 to FIG. 13B, the transfer electrode layer includes a first transfer electrode 341 and a second transfer electrode 342. The first transfer electrode 341 is connected to the second main semiconductor layer 331 of the main light emitting element E1 through a first via K1 opened on the first insulation layer 36, and the second transfer electrode 342 is connected to the second auxiliary semiconductor layer 332 of the auxiliary light emitting element E2 through a second via K2 opened on the first insulation layer 36. The bonding electrode layer includes a first bonding electrode 353 and second bonding electrodes 351 and 352. The second bonding electrode 351 is connected to the first transfer electrode 341 through a third via K3, the second bonding electrode 352 is connected to the second transfer electrode 342 through a fourth via K4, and the first bonding electrode 353 is connected to the first semiconductor layer through a fifth via K5.

In the present exemplary implementation, the light emitting diode chip includes a main light emitting element E1 and an auxiliary light emitting element E2 that may independently emit light, which may reduce the current density flowing through the main light emitting element E1 and the auxiliary light emitting element E2 and be beneficial to the improving the phenomenon of heat accumulation.

Figure 14:
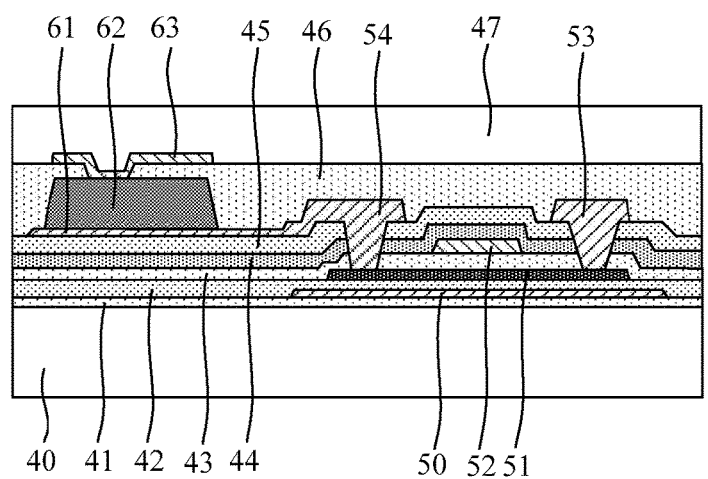
FIG. 14 is a partial sectional view of a circuit structure layer of a display substrate according to at least one embodiment of the present disclosure.

FIG. 14 is a partial sectional view of a circuit structure layer of a display substrate according to at least one embodiment of the present disclosure. In FIG. 14, it is illustrated by taking the detection element PD and one transistor (for example, one transistor connected to the detection element PD) as an example.

In some exemplary implementations, as shown in FIG. 14, in a plane perpendicular to the display substrate, the circuit structure layer may include a light shielding layer, a third semiconductor layer, a first conductive layer, a second conductive layer, a third conductive layer, a photoelectric conversion layer, and a fourth conductive layer that are arranged sequentially on the base substrate 40. A third insulation layer 41 may be provided between the base substrate 40 and the light shielding layer, a fourth insulation layer 42 may be provided between the light shielding layer and the third semiconductor layer, a fifth insulation layer 43 may be provided between the third semiconductor layer and the first conductive layer, a sixth insulation layer 44 may be provided between the first conductive layer and the second conductive layer, a seventh insulation layer 45 may be provided between the second conductive layer and the third conductive layer, and an eighth insulation layer 46 may be provided between the photoelectric conversion layer and the fourth conductive layer. A pixel definition layer 47 may be provided on a side of the fourth conductive layer away from the base substrate 40. In some examples, the third insulation layer 41 to the seventh insulation layer 45 may be inorganic insulation layers, and the eighth insulation layer 46 may be an organic insulation layer. However, the present embodiment is not limited thereto.

In some exemplary implementations, as shown in FIG. 14, the light shielding layer may include a light shielding electrode 50. The third semiconductor layer at least includes a first active layer 51. An orthographic projection of the light shielding electrode 50 on the base substrate 40 may cover an orthographic projection of the first active layer 51 on the base substrate 40 to avoid the influence of external light on the active layer. The first conductive layer at least includes a first gate electrode 52 and a first electrode of the capacitor (not shown). The second conductive layer at least includes a second electrode of the capacitor (not shown). The third conductive layer at least includes a first source electrode 53, a first drain electrode 54, and a first electrode 61 of the detection element. The photoelectric conversion layer includes a photoelectric conversion structure 62 of the detection element. The fourth conductive layer includes a second electrode 63 of the detection element. The transistor shown in FIG. 14 may include a first active layer 51, a first gate electrode 52, a first source electrode 53 and a first drain electrode 54. The detection element may include a first electrode 61, a photoelectric conversion structure 62 and a second electrode 63 which are stacked sequentially. In some examples, the first electrode 61 of the detection element and the first drain electrode 54 of the connected transistor may be of an integral structure. However, the present embodiment is not limited thereto.

The structure of the display substrate will be described below through an example of a preparation process of the display substrate. A "patterning process" mentioned in the present disclosure includes film layer deposition, photoresist coating, mask exposure, development, etching, and photoresist stripping. Deposition may be any one or more of sputtering, evaporation, and chemical vapor deposition. Coating may be any one or more of spray coating and spin coating. Etching may be any one or more of dry etching and wet etching. A "thin film" refers to a layer of a thin film prepared from a material on a underlay substrate using a process of deposition or coating. If a patterning process is not needed for the "thin film" during a whole preparation process, the "thin film" may be referred to as a "layer". When a patterning process is needed for the "thin film" during the whole preparation process, the thin film is referred to as a "thin film" before the patterning process and referred to as a "layer" after the patterning process. The "layer" after the patterning process includes at least one "pattern".

"A and B are arranged in the same layer" mentioned in the present disclosure refers to that A and B are simultaneously formed by the same patterning process. The "thickness" of the thin film layer is a size of the film layer in a direction perpendicular to the display substrate. In the exemplary embodiment of the present disclosure, "a projection of A includes a projection of B" refers to that a boundary of a projection of B falls within a range of a boundary of a projection of A or the boundary of a projection of A is overlapped with the boundary of a projection of B.

In some exemplary implementations, the preparation process of the light emitting diode chip may include the following operations as shown in FIG. 9A to FIG. 13B.

(1) A first semiconductor layer, a quantum well layer, and a second semiconductor layer are sequentially formed on the underlay substrate 30, as shown in FIG. 10A and FIG. 10B.

In some exemplary implementations, a first semiconductor thin film is formed on a side of the underlay substrate 30, and a first semiconductor layer 311 of the main light emitting element E1 and a first semiconductor layer 312 of the auxiliary light emitting element E2 are formed after the first semiconductor film is patterned. The first semiconductor layer 311 of the main light emitting element E1 and the first semiconductor layer 312 of the auxiliary light emitting element E2 are of an integral structure. Subsequently, the quantum well layer 321 of the main light emitting element E1 and the quantum well layer 322 of the auxiliary light emitting element E2 are formed on a side of the first semiconductor layer away from the underlay substrate 30. Subsequently, a second semiconductor layer 331 of the main light emitting element E1 and a second semiconductor layer 332 of the auxiliary light emitting element E2 are formed on a side of the quantum well layer away from the underlay substrate 30.

In some exemplary implementations, the underlay substrate 30 may be a gallium phosphide (GaP) underlay substrate, a gallium arsenide (GaAs) underlay substrate, a silicon underlay substrate, a silicon carbide underlay substrate, a sapphire underlay substrate, or the like. However, the present embodiment is not limited thereto.

In some exemplary implementations, the material of the quantum well layer may include gallium nitride (GaN). The doping types of the first semiconductor layer and the second semiconductor layer may be different. For example, the material of the first semiconductor layer may be an N-type semiconductor material and the material of the second semiconductor layer may be a P-type semiconductor material. Alternatively, the material of the first semiconductor layer may be a P-type semiconductor material, and the material of the second semiconductor layer may be an N-type semiconductor material. The intrinsic semiconductor material in the first semiconductor layer and the second semiconductor layer may be the same, and the intrinsic semiconductor material may be any one of GaN, GaP, aluminum gallium arsenide (AlGaAs) and aluminum gallium indium phosphide (AlGaInP).

In some exemplary implementations, the thicknesses of the first semiconductor layer, the multiple quantum well layer and the second semiconductor layer may be set according to actual needs, which are not limited herein.

(2) A first insulation layer is formed.

In some exemplary implementations, a first insulation thin film is formed on a side of the second semiconductor layer away from the underlay substrate 30, and the first insulation film is patterned to form the first insulation layer 36, as shown in FIG. 11A and FIG. 11B. A first via K1 and a second via K2 are provided on the first insulation layer 36. The first insulation layer 36 within the first via K1 is etched away to expose a surface of the second semiconductor layer 331, and the first insulation layer 36 within the second via K2 is etched away to expose a surface of the second semiconductor layer 332. An orthographic projection of the first via K1 and the second via K2 on the underlay substrate 30 may be a rectangular shape. However, the present embodiment is not limited thereto.

(3) A transfer electrode layer is formed.

In some exemplary implementations, a transfer electrode thin film is formed on a side of the first insulation layer 36 away from the underlay substrate 30, and the transfer electrode thin film is patterned to form the transfer electrode layer, as shown in FIG. 12A and FIG. 12B. The transfer electrode layer includes a first transfer electrode 341 and a second transfer electrode 342. The first transfer electrode 341 is connected to the second semiconductor layer 331 of the main light emitting element E1 through the first via K1, and the second transfer electrode 342 is connected to the second semiconductor layer 332 of the auxiliary light emitting element E2 through the second via K2.

(4) A second insulation layer and an encapsulation layer are formed.

In some exemplary implementations, the second insulation layer 37 and the encapsulation layer 38 are sequentially formed on a side of the transfer electrode layer away from the underlay substrate 30, as shown in FIG. 13A and FIG. 13B. A first sub-via, a second sub-via and a third sub-via are provided on the second insulation layer 37, and a fourth sub-via corresponding to the first sub-via, a fifth sub-via corresponding to the second sub-via and a sixth sub-via corresponding to the third sub-via are provided on the encapsulation layer 38. The first sub-via and the fourth sub-via form a third via K3, the second sub-via and the fifth sub-via form a fourth via K4, and the third sub-via and the sixth sub-via form a fifth via K5. The third via K3 exposes a surface of the first transfer electrode 341, the fourth via K4 exposes a surface of the second transfer electrode 342, and the fifth via K5 exposes a surface of the first semiconductor layer. An orthographic projection of the third via K3, the fourth via K4, and the fifth via K5 on the underlay substrate 30 may be a rectangular shape. However, the present embodiment is not limited thereto.

(5) A bonding electrode layer is formed.

In some exemplary implementations, a metal thin film is formed on a side of the encapsulation layer 38 away from the underlay substrate 30, and the metal thin film is patterned to form the bonding electrode layer, as shown in FIG. 9A and FIG. 9B. The bonding electrode layer includes a first bonding electrode 353 and second bonding electrodes 351 and 352. The second bonding electrode 351 is connected to the first transfer electrode 341 through a third via K3, the second bonding electrode 352 is connected to the second transfer electrode 342 through a fourth via K4, and the first bonding electrode 353 is connected to the first semiconductor layer through a fifth via K5. The main light emitting element E1 may be connected to the main drive circuit through the second bonding electrode 351, the auxiliary light emitting element E2 may be connected to the auxiliary drive circuit through the second bonding electrode 352, and the main light emitting element E1 and the auxiliary light emitting element E3 may be connected to the second power supply line through the first bonding electrode 353. In this example, the first bonding electrodes of the main light emitting element E1 and the auxiliary light emitting element E2 are of an integral structure. However, the present embodiment is not limited thereto.

In some exemplary implementations, an orthographic projection of the first semiconductor layer 311 of the main light emitting element E1 on the underlay substrate 30 contains an orthographic projection of the quantum well layer 321 on the underlay substrate 30, and the orthographic projection of the quantum well layer 321 on the underlay substrate 30 contains an orthographic projection of the second semiconductor layer 331 on the underlay substrate 30. An orthographic projection of the first semiconductor layer 312 of the auxiliary light emitting element E2 on the underlay substrate 30 contains an orthographic projection of the quantum well layer 322 on the underlay substrate 30, and the orthographic projection of the quantum well layer 322 on the underlay substrate 30 contains an orthographic projection of the second semiconductor layer 332 on the underlay substrate 30. In this way, it is convenient to achieve an electrical connection between the first bonding electrode 353 and the first semiconductor layer.

In some exemplary implementations, the first insulation layer 36 and the second insulation layer 37 may be made of any one or more of silicon oxide (SiOx), silicon nitride (SiNx) and silicon oxynitride (SiON), and may be a monolayer, a multi-layer or a composite layer. The material of the transfer electrode layer may be a material having a higher light transmittance, for example indium tin oxide (ITO). The bonding electrode layer may be made of a metal material, e.g., any one or more of Argentum (Ag), Copper (Cu), Aluminum (Al), Titanium (Ti), and Molybdenum (Mo), or an alloy material of the abovementioned metals, e.g., an Aluminum-Neodymium alloy (AlNd) or a Molybdenum-Niobium alloy (MoNb), and may be a single-layer structure, or a multilayer composite structure such as Ti/Al/Ti. However, the present embodiment is not limited thereto.

In some exemplary implementations, after a circuit structure layer is formed on the base substrate of the display substrate, a plurality of light emitting diode chips may be transferred to be printed onto the base substrate to achieve an electrical connection of the light emitting diode chips to the circuit structure layer. The bonding electrode layer of the light emitting diode chip faces the circuit structure layer, which achieves the electrically connection to the circuit structure layer, so that the circuit structure layer provides an electrical signal to the light emitting diode chip. In some examples, the structure of the circuit structure layer may be shown with reference to FIG. 14, and therefore will not be repeated here.

In some exemplary implementations, after the light emitting diode chip is bound to the main drive circuit and the auxiliary drive circuit in the circuit structure layer, the underlay substrate of the light emitting diode chip may be stripped, so that the light emitting diode chip in the display substrate only includes the main light emitting element and the auxiliary light emitting element. However, the present embodiment is not limited thereto. For example, after the light emitting diode chip is bound to the circuit structure layer, the underlay substrate may be retained.

Figure 15:
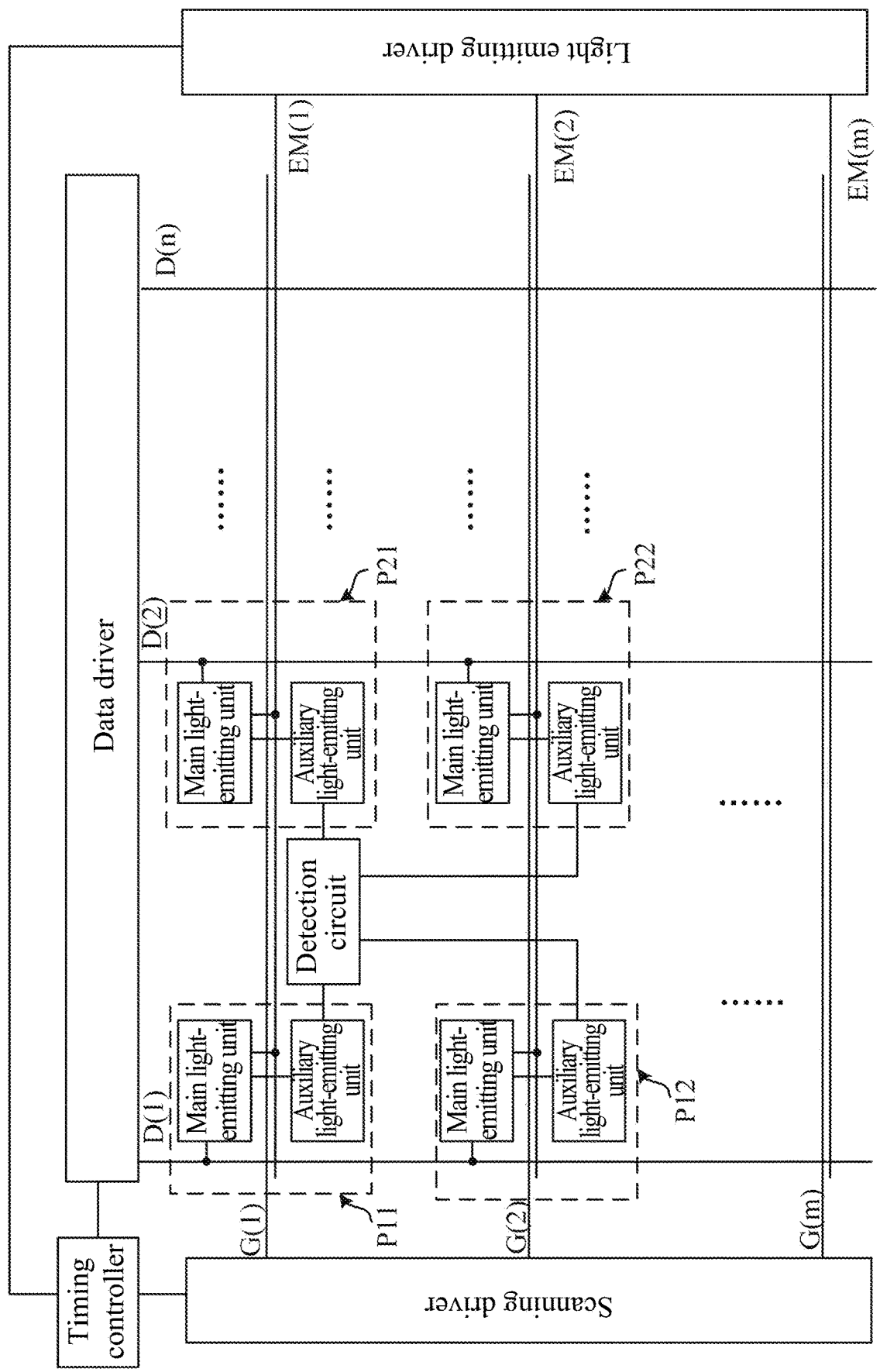
FIG. 15 is a schematic diagram of another structure of a display substrate according to at least one embodiment of the present disclosure.

FIG. 15 is schematic diagram of another structure of a display substrate according to at least one embodiment of the present disclosure. In some exemplary implementations, as shown in FIG. 15, the display substrate includes a timing controller, a data driver, a scan driver, a light emitting driver, a pixel array and a plurality of compensation circuits. The pixel array may include a plurality of scan lines (e.g. G (1) to G (m)), a plurality of data lines (e.g. D (1) to D (n)), a plurality of pixel units, and a plurality of light emitting control lines (e.g. EM (1) to EM (m)), wherein, m and n are both natural numbers. In this example, the compensation circuit may include one detection circuit. The detection circuit is configured to detect a temperature of the pixel unit. For example, one detection circuit may be connected to auxiliary light emitting units of four pixel units. However, the present embodiment is not limited thereto.

Rest of the structure of the display substrate according to this embodiment may refer to descriptions of the aforementioned embodiments, and will not be repeated here.

Figure 16:
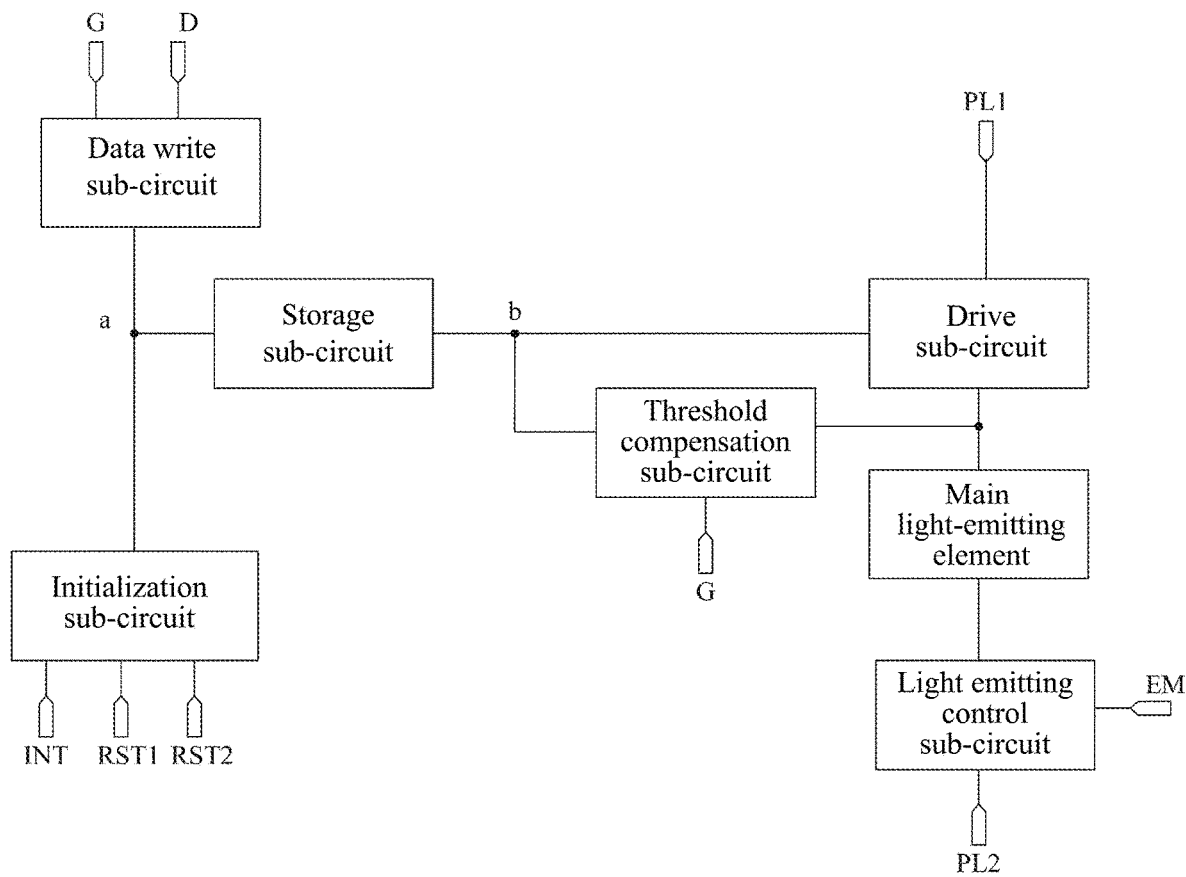
FIG. 16 is a schematic diagram of a structure of a main drive circuit of a pixel unit according to at least one embodiment of the present disclosure.

FIG. 16 is a schematic diagram of a structure of a main drive circuit according to at least one embodiment of the present disclosure. In some exemplary implementations, as shown in FIG. 16, the main drive circuit includes a data write sub-circuit, a drive sub-circuit, a threshold compensation sub-circuit, a storage sub-circuit, an initialization sub-circuit and a light emitting control sub-circuit.

In some exemplary implementations, the data write sub-circuit is connected to a third scan line G, a data line D, and a fifth node a, and is configured to write the data signal provided by the data line D to the storage sub-circuit under the control of the third scan line G. The storage sub-circuit is connected to the fifth node a and a sixth node b. The drive sub-circuit is connected to the sixth node b, a first power supply line PL1, and a first electrode of the main light emitting element E1, and is configured to output a drive current to the main light emitting element E1 under the control of the sixth node b. The threshold compensation sub-circuit is connected to the third scan line G, the sixth node b, and the first electrode of the main light emitting element E1, and is configured to compensate a threshold voltage of the drive sub-circuit under the control of the third scan line G. The initialization sub-circuit is connected to the fifth node a, an initial signal line INT, a first reset line RST1 and a second reset line RST2, and is configured to initialize the fifth node a under the control of the first reset line RST1 or the second reset line RST2. The light emitting control sub-circuit is connected to a light emitting control line EM, a second power supply line PL2, and a second electrode of the main light emitting element E1, and is configured to turn on the second electrode of the main light emitting element E1 and the second power supply line PL2 under the control of the light emitting control line EM.

In some exemplary implementations, the first power supply line PL1 keeps providing high-level signals, and the second power supply line PL2 keeps providing low-level signals. The first reset line RST1 of the main drive circuit of pixel circuit of row i is connected to a third scan line G (i+1) to which the main drive circuit of the pixel circuit of row i+1 is connected, and the second reset line RST2 of the main drive circuit of the pixel circuit of row i is connected to a third scan line G (i−1) to which the main drive circuit of the pixel circuit of row i−1 is connected, wherein i may be an integer.

Figure 17:
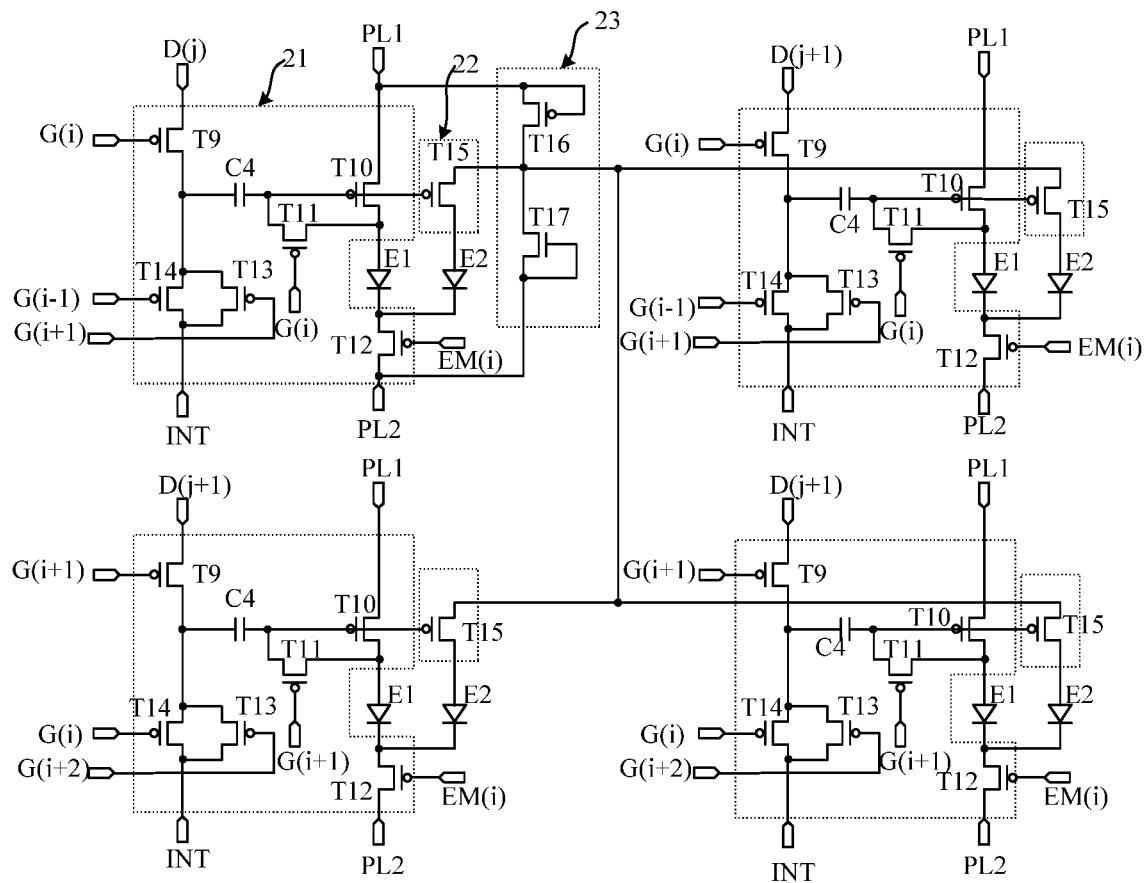
FIG. 17 is a schematic diagram of a circuit structure of a display substrate according to at least one embodiment of the present disclosure.
Figure 18:
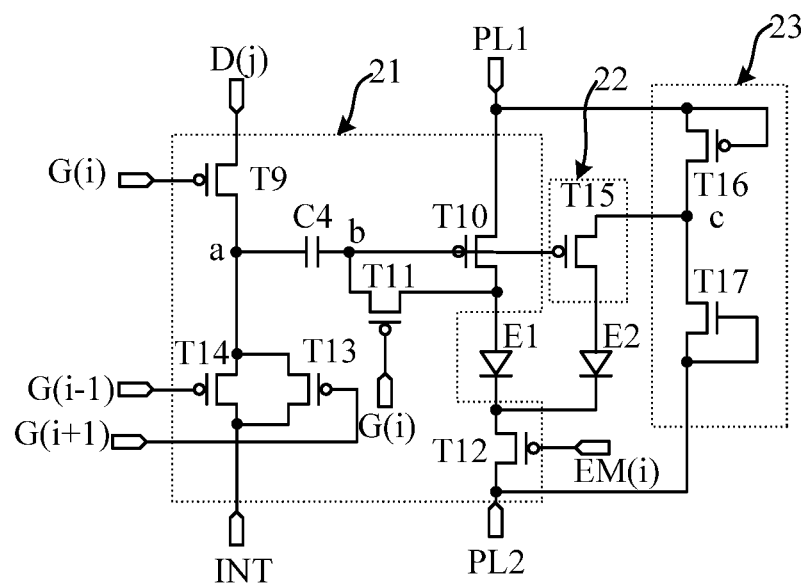
FIG. 18 is a schematic diagram of a partial circuit structure of a display substrate according to at least one embodiment of the present disclosure.

FIG. 17 is a schematic diagram of a circuit structure of a display substrate according to at least one embodiment of the present disclosure. FIG. 18 is a schematic diagram of a partial circuit structure of a display substrate according to at least one embodiment of the present disclosure. Four pixel units (for example, a pixel unit of row i and column j, a pixel unit of row i and column j+1, and a pixel unit of row i+1 and column j+1) and one detection circuit are illustrated in FIG. 17. One pixel unit (e.g. a pixel unit of row i and column j) and one detection circuit are illustrated in FIG. 18, wherein both i and j are integers.

In some exemplary implementations, as shown in FIG. 18, the data write sub-circuit of the main drive circuit 21 of the pixel unit of row i and column j includes a ninth transistor T9, the drive control sub-circuit includes a tenth transistor T10, the threshold compensation sub-circuit includes an eleventh transistor T11, the light emitting control sub-circuit includes a twelfth transistor T12, the initialization sub-circuit includes a thirteenth transistor T13 and the fourteenth transistor T14, and the storage sub-circuit includes a fourth capacitor C4. A control electrode of the ninth transistor T9 is connected to the first scan line G (i), a first electrode of the ninth transistor T9 is connected to the data line D (j), and a second electrode of the ninth transistor T9 is connected to the fifth node a. A control electrode of the tenth transistor T10 is connected to the sixth node b, a first electrode of the tenth transistor T10 is connected to the first power supply line PL1, and a second electrode of the tenth transistor T10 is connected to the first electrode of the main light emitting element E1. A control electrode of the eleventh transistor T11 is connected to the first scan line G (i), a first electrode of the eleventh transistor T11 is connected to the sixth node b, and a second electrode of the eleventh transistor T11 is connected to the second electrode of the tenth transistor T10. A control electrode of the twelfth transistor T12 is connected to the light emitting control line EM (i), a first electrode of the twelfth transistor T12 is connected to the second electrode of the main light emitting element E1, and a second electrode of the twelfth transistor T12 is connected to the second power supply line PL2. A control electrode of the thirteenth transistor T13 is connected to the first reset line G (i+1), a first electrode of the thirteenth transistor T13 is connected to the initial signal line INT, and a second electrode of the thirteenth transistor T13 is connected to the fifth node a. A control electrode of the fourteenth transistor T14 is connected to the second reset line G (i−1), a first electrode of the fourteenth transistor T14 is connected to the initial signal line INT, and a second electrode of the fourteenth transistor T14 is connected to the fifth node a.

In this example, a potential of the fifth node a is the same as potentials of the second electrode of the ninth transistor T9, the first electrode of the fourth capacitor C4, the second electrode of the thirteenth transistor T13, and the second electrode of the fourteenth transistor T14. A potential of the sixth node b is the same as potentials of the second electrode of the fourth capacitor C4, the control electrode of the tenth transistor T10, and the first electrode of the eleventh transistor T11.

In some exemplary implementations, as shown in FIG. 18, the auxiliary drive circuit 22 of the pixel unit of row i and column j includes a fifteenth transistor T15. A control electrode of the fifteenth transistor T15 is connected to the main drive circuit 21, a first electrode of the fifteenth transistor T15 is connected to the detection circuit 23, and a second electrode of the fifteenth transistor T15 is connected to the first electrode of the auxiliary light emitting element E2. In this example, a control electrode of the fifteenth transistor T15 is connected to the sixth node b, and a first electrode of the fifteenth transistor T15 is connected to the seventh node c. A second electrode of the auxiliary light emitting element E2 is connected to the second electrode of the main light emitting element E1.

In some exemplary implementations, as shown in FIG. 18, the detection circuit 23 includes a first detection transistor T16 and a second detection transistor T17. Both a control electrode and a first electrode of the first detection transistor T16 are connected to the first power supply line PL1, and a second electrode of the first detection transistor T16 is connected to a seventh node c. A control electrode and the first electrode of the second detection transistor T17 are connected to the second power supply line PL2, and a second electrode of the second detection transistor T17 is connected to the seventh node c. In some examples, the doping types of the first detection transistor T16 and the second detection transistor T17 are opposite. For example, the first detection transistor T16 may be a P-type transistor and the second detection transistor T17 may be an N-type transistor. In this example, a potential of the seventh node c is the same as potentials of the second electrode of the first detection transistor T16 and the second electrode of the second detection transistor T17. The seventh node c is connected to the first electrodes of the fifteenth transistors T15 of the plurality of auxiliary drive circuits 22.

In the present exemplary implementation, the sixth node b simultaneously controls the drive transistor of the main drive circuit 21 (i.e. the tenth transistor T10) and the drive transistor of the auxiliary drive circuit 22 (i.e. the fifteenth transistor T15). By setting a ratio of channel widths to lengths of the tenth transistor T10 and the fifteenth transistor T15 to be the same, the threshold voltages of the two driver transistors may be made substantially the same.

In the present exemplary implementation, the detection circuit 23 is configured to detect temperatures of a plurality of pixel units. A P-type transistor and an N-type transistor in series are used to compose of one temperature sensor. Since the leakage current of the P-type transistor increases with the increase of temperature, and the leakage current of the N-type transistor changes little with temperature, the potential of the seventh node c increases with the increase of temperature. The potential of the seventh node c may be supplied to the fifteenth transistor T15 of the auxiliary drive circuit 22 to generate a drive current, so that the drive current flowing through the auxiliary light emitting element E2 becomes large, thereby achieving the brightness compensation after temperature rise.

Figure 19:
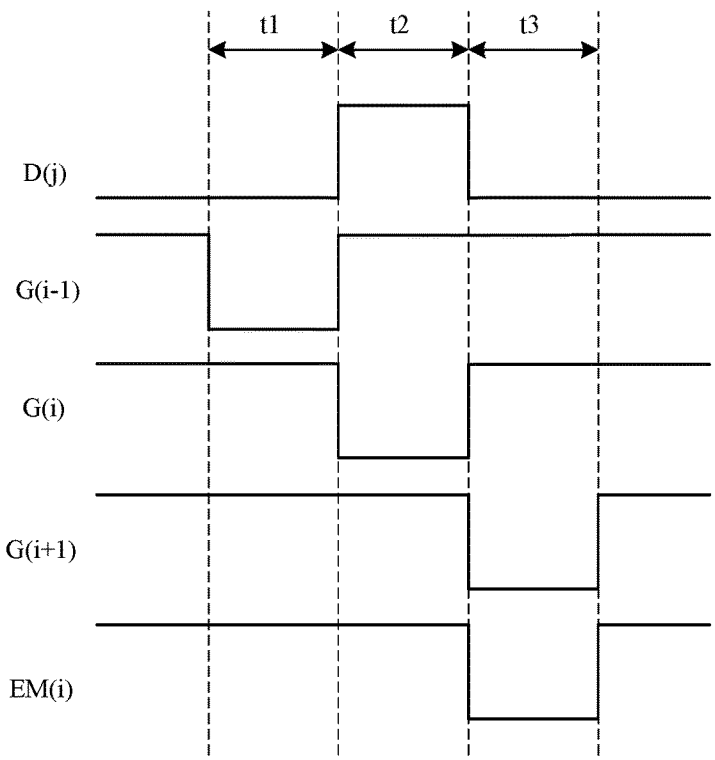
FIG. 19 is a working timing diagram of a pixel unit according to at least one embodiment of the present disclosure.

FIG. 19 is a working timing diagram of a pixel unit according to at least one embodiment of the present disclosure. In some exemplary implementations, as shown in FIG. 18 and FIG. 19, it is illustrated by taking the operation process of the pixel unit of row i and column j is as an example. The operation process of the pixel unit of row i and column j includes the following stages.

In the initialization stage t1, the second reset line G (i−1) supplies a low-level signal, and the fourteenth transistor T14 is turned on to supply the initial voltage supplied by the initial signal line INT to the fifth node a, that is, the first electrode of the fourth capacitor C4 is reset. The first scan line G (i), the first reset line G (i+1), and the light emitting control line EM (i) provide high-level signals, and the ninth transistor T9, the eleventh transistor T11, the twelfth transistor T12, and the fourteenth transistor T14 are turned off.

In the data write and compensation stage t2, the first scan line G (i) provides a low-level signal, and the ninth transistor T9 and the eleventh transistor T11 are turned on. The ninth transistor T9 is turned on, so that the data voltage output from the data line D (j) is supplied to the fifth node a, and a potential of the fifth node A is the data voltage Vdata. The eleventh transistor T11 is turned on to charge the first power supply voltage Vdd supplied from the first power supply line PL1 and the threshold voltage Vth of the tenth transistor T10 to the sixth node b, so that a potential of the sixth node b is Vdd+Vth.

In the light emitting stage t3, the light emitting control line EM (i) and the first reset line G (i+1) provide low-level signals, and the twelfth transistor T12 and the thirteenth transistor T13 are turned on. The potential of the fifth node a jumps to an initial voltage Vint supplied by the initial signal line INT, and the potential of the sixth node b (that is, the control electrode potential of the tenth transistor T10) jumps to Vb=Vdd+Vth−(Vdata−Vint). At this time, the tenth transistor T10 is in a saturated state, and a gate-source voltage difference of the tenth transistor T10 is: Vsg−Vs−Vb=Vdd−[Vdd+Vth−(Vdata−Vint)]=Vdata−Vth−Vint. The tenth transistor T10 may supply the drive current to the main light emitting element E1. The drive current flowing through the main light emitting element E1 may be:

$$I = K(Vgs - Vth)^2 =$$
$$K(Vsg + Vth)^2 = K(Vdata - Vth - Vint + Vth)^2 = K(Vdata - Vint)^2;$$

wherein K is a fixed constant related to the process parameters and geometric dimensions of the drive transistor; Vdata is a data voltage and Vint is an initial voltage supplied by the initial signal line.

It may be seen that the drive current of the main light emitting element E1 is independent of the threshold voltage of the tenth transistor T10, thereby ensuring stable display of the main light emitting element E1. The present example may achieve the internal compensation of the threshold voltage.

In some exemplary implementation, in the light emitting stage, the auxiliary drive circuit 22 may supply a drive current to the auxiliary light emitting element E2 according to the potential of the seventh node c, so as to compensate the brightness of the main light emitting element E1. In this example, the detection result of the detection circuit 23 may control the light emitting brightness of the auxiliary light emitting element E2, so that the light emitting brightness of the auxiliary light emitting element E2 may compensate for the brightness loss due to the temperature rise.

The preparation process of the display substrate according to the embodiment may refer to descriptions of the aforementioned embodiments, and thus will not be repeated here.

Figure 20:
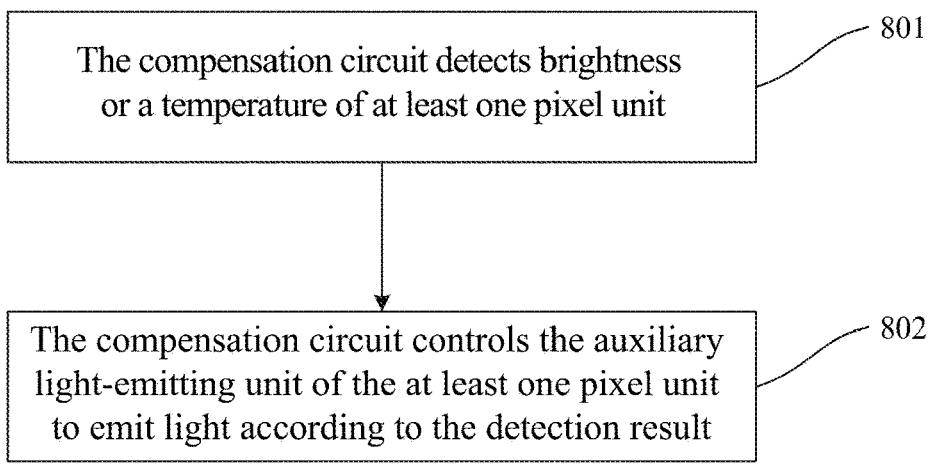
FIG. 20 is a flowchart of a brightness compensation method for a display substrate according to at least one embodiment of the present disclosure.

FIG. 20 is a flowchart of a brightness compensation method for a display substrate according to at least one embodiment of the present disclosure. As shown in FIG. 20, the brightness compensation method of the present embodiment is applied to the aforementioned display substrate. The brightness compensation method comprises the following steps.

In step 801, the compensation circuit detects a brightness or a temperature of at least one pixel unit; and in step 802, the compensation circuit controls the auxiliary light emitting unit of the at least one pixel unit to emit light according to the detection result.

The brightness compensation method according to the embodiment may refer to the descriptions in the above-mentioned embodiments, and thus will not be repeated herein.

Figure 21:
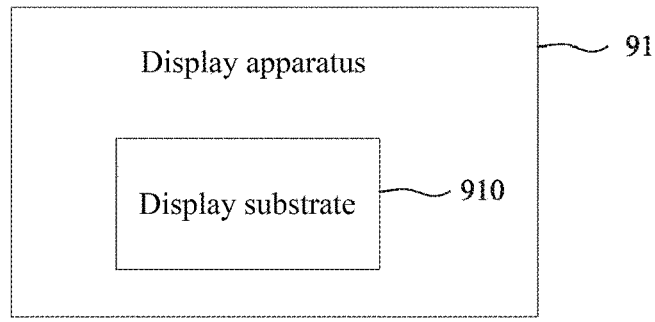
FIG. 21 is a schematic diagram of a display apparatus according to at least one embodiment of the present disclosure.

FIG. 21 is a schematic diagram of a display apparatus according to at least one embodiment of the present disclosure. As shown in FIG. 21, a display apparatus 91 is provided in this embodiment, which includes a display substrate 910 in the aforementioned embodiments. In some examples, the display substrate 910 may be an OLED display substrate or a QLED display substrate. The display apparatus 91 may be any product or component with a display function, such as a mobile phone, a tablet computer, a television, a display, a laptop computer, a digital photo frame, and a navigator. However, the present embodiment is not limited thereto.

The drawings of the present disclosure only involve structures involved in the present disclosure, and other structures may refer to conventional designs. The embodiments of the present disclosure and features in the embodiments may be combined to each other to obtain new embodiments if there is no conflict.

Those of ordinary skills in the art should understand that modifications or equivalent replacements of the technical solutions of the present disclosure may be made without departing from the spirit and scope of the technical solutions of the present disclosure, and shall all fall within the scope of the claims of the present disclosure.

The invention claimed is:

1. A display substrate, comprising:
a plurality of pixel units and at least one compensation circuit;
wherein at least one pixel unit comprises a main light emitting unit and an auxiliary light emitting unit; the at least one compensation circuit is connected with the auxiliary light emitting unit of at least one pixel unit; and
the at least one compensation circuit is configured to detect a brightness of the at least one pixel unit and control the auxiliary light emitting unit of the at least one pixel unit to emit light according to a detection result,
wherein the compensation circuit comprises a compensation control circuit and at least one detection circuit connected to the compensation control circuit; the detection circuit is connected with the auxiliary light emitting unit of one pixel unit;
the detection circuit is configured to detect a brightness of the connected pixel unit; and
the compensation control circuit is configured to control the auxiliary light emitting unit connected to the detection circuit to emit light according to a detection result of the detection circuit,
wherein the compensation control circuit comprises a first control sub-circuit and a second control sub-circuit;
wherein the first control sub-circuit is connected to a first scan line, one voltage detection circuit and one detection circuit, and is configured to transmit the detection result of the detection circuit to the voltage detection circuit under the control of the first scan line, so that an external control circuit connected to the voltage detection circuit updates a compensation control signal according to the detection result; and
the second control sub-circuit is connected with the first scan line, a compensation data line, a second power supply line and at least one detection circuit, and is configured to transmit the compensation control signal provided by the compensation data line to the at least one detection circuit under the control of the first scan line, so as to control the at least one detection circuit to transmit the detection result to a corresponding auxiliary light emitting unit.

2. The display substrate according to claim 1, wherein the first control sub-circuit comprises a seventh transistor; the second control sub-circuit comprises an eighth transistor and a second capacitor;
wherein a control electrode of the seventh transistor is connected to the first scan line, a first electrode of the seventh transistor is connected to the voltage detection circuit, and a second electrode of the seventh transistor is connected to the detection circuit;
a control electrode of the eighth transistor is connected to the first scan line, a first electrode of the eighth transistor is connected to the compensation data line, a second electrode of the eighth transistor is connected to a second electrode of the second capacitor, and a first electrode of the second capacitor is connected to the second power supply line; and the second electrode of the eighth transistor is connected to the at least one detection circuit.

3. The display substrate according to claim 1, wherein the detection circuit comprises a detection element, a fifth transistor, and a sixth transistor;
wherein a first electrode of the detection element is connected to a second electrode of the sixth transistor, and a second electrode of the detection element is connected to a second power supply line; a control electrode and a first electrode of the sixth transistor are connected with a first power supply line; and a control electrode of the fifth transistor is connected to the compensation control circuit, a first electrode of the fifth transistor is connected to the first electrode of the detection element, and a second electrode of the fifth transistor is connected to the auxiliary light emitting unit.

4. The display substrate according to claim 1, wherein the main light emitting unit comprises a main light emitting element and a main drive circuit connected to the main light emitting element;
wherein the main drive circuit comprises a first transistor, a second transistor, a third transistor and a first capacitor; a control electrode of the first transistor is connected to a first scan line, a first electrode of the first transistor is connected to a data line, and a second electrode of the first transistor is connected to a control electrode of the second transistor; a first electrode of the second transistor is connected to a first power supply line, and a second electrode of the second transistor is connected to a first electrode of the third transistor; a control electrode of the third transistor is connected to a second scan line, and a second electrode of the third transistor is connected to a voltage detection circuit; a first electrode of the first capacitor is connected to the control electrode of the second transistor, and a second electrode of the first capacitor is connected to the second electrode of the second transistor; and
a first electrode of the main light emitting element is connected with the second electrode of the second transistor, and a second electrode of the main light emitting element is connected with a second power supply line.

5. The display substrate according to claim 1, wherein the auxiliary light emitting unit comprises an auxiliary light emitting element and an auxiliary drive circuit connected to the auxiliary light emitting element;
wherein the auxiliary drive circuit comprises a fourth transistor; a control electrode of the fourth transistor is connected to the detection circuit, a first electrode of the fourth transistor is connected to a first power supply line, and a second electrode of the fourth transistor is connected to a first electrode of the auxiliary light emitting element; and a second electrode of the auxiliary light emitting element is connected with a second power supply line.

6. The display substrate according to claim 1, wherein the main light emitting unit comprises a main light emitting element and a main drive circuit; the auxiliary light emitting unit comprises an auxiliary light emitting element and an auxiliary drive circuit; wherein both the main light emitting element and the auxiliary light emitting element are micro light emitting elements; and a light emitting area of the main light emitting element is larger than the light emitting area of the auxiliary light emitting element.

7. The display substrate according to claim 6, comprising: a base substrate, a circuit structure layer arranged on the base substrate, and a plurality of light emitting diode chips; wherein the circuit structure layer comprises the compensation circuit and a main drive circuit and an auxiliary drive circuit of the pixel unit; at least one light emitting diode chip comprises a main light emitting element and an auxiliary light emitting element of the pixel unit;
the main light emitting element and the auxiliary light emitting element each comprises a first semiconductor layer, a quantum well layer and a second semiconductor layer stacked in sequence; doping types of the first semiconductor layer and the second semiconductor layer are different;
the main light emitting element and the auxiliary light emitting element each further comprises at least one of a first bonding electrode and a second bonding electrode;
the first bonding electrode of the main light emitting element is connected to the first semiconductor layer of the main light emitting element, and the second bonding electrode of the main light emitting element is connected to the second semiconductor layer of the main light emitting element; and
the first bonding electrode of the auxiliary light emitting element is connected to the first semiconductor layer of the auxiliary light emitting element, and the second bonding electrode of the auxiliary light emitting element is connected to the second semiconductor layer of the auxiliary light emitting element.

8. The display substrate according to claim 7, wherein the first semiconductor layer of the main light emitting element and the first semiconductor layer of the auxiliary light emitting element are of an integral structure, and are connected to the same first bonding electrode.

9. The display substrate according to claim 7, wherein the light emitting diode chip further comprises a underlay substrate, and the main light emitting element and the auxiliary light emitting element are located on a same side of the underlay substrate.

10. A display apparatus, comprising a display substrate according to claim 1.

11. A brightness compensation method for a display substrate applied to the display substrate according to claim 1, wherein the brightness compensation method comprises:
detecting a brightness of at least one pixel unit by a compensation circuit; and
controlling an auxiliary light emitting unit of the at least one pixel unit by the compensation circuit to emit light according to the detection result.

* * * * *